United States Patent [19]

Cho et al.

[11] Patent Number: 5,023,554

[45] Date of Patent: Jun. 11, 1991

[54] FRINGE FIELD MRI

[75] Inventors: Zang-Hee Cho, Corona Del Mar; Edward K. Wong, Jr., Newport Beach, both of Calif.

[73] Assignee: The Reagents of the University of California, Oakland, Calif.

[21] Appl. No.: 354,990

[22] Filed: May 22, 1989

[51] Int. Cl.$^5$ .............................................. G01R 33/20
[52] U.S. Cl. ..................................... 324/309; 324/318
[58] Field of Search .............. 324/300, 307, 306, 311, 324/312, 318, 319, 309

[56] References Cited

U.S. PATENT DOCUMENTS

| | | | |
|---|---|---|---|
| 4,486,709 | 0/1984 | Bendall . | |
| 4,534,358 | 8/1985 | Young . | |
| 4,591,789 | 5/1986 | Glover et al. . | |
| 4,595,899 | 6/1986 | Smith | 324/320 |
| 4,617,936 | 10/1986 | Malko . | |
| 4,634,980 | 1/1987 | Misic et al. | 324/306 |
| 4,638,252 | 1/1987 | Bradshaw . | |
| 4,652,826 | 3/1987 | Yamamoto et al. . | |
| 4,680,551 | 7/1987 | O'Donnell et al. . | |
| 4,684,890 | 8/1987 | Briguet et al. . | |
| 4,684,893 | 8/1987 | Kojima et al. . | |
| 4,692,705 | 9/1987 | Hayes . | |
| 4,694,249 | 9/1987 | Post et al. . | |
| 4,703,270 | 10/1987 | Hall et al. . | |
| 4,707,664 | 11/1987 | Fehn et al. . | |
| 4,714,885 | 12/1987 | Paltiel et al. . | |
| 4,721,914 | 1/1988 | Fukushima et al. . | |
| 4,727,327 | 2/1988 | Toyoshima et al. . | |
| 4,733,190 | 3/1988 | Dembinski . | |
| 4,740,751 | 4/1988 | Misic et al. . | |
| 4,742,303 | 5/1988 | Bendall . | |
| 4,777,956 | 10/1988 | Macovski | 324/309 |
| 4,797,617 | 1/1989 | Misic et al. | 324/322 |
| 4,814,709 | 3/1989 | Takeda | 324/309 |
| 4,876,508 | 10/1989 | Taylor | 324/309 |

FOREIGN PATENT DOCUMENTS 2149124A 10/1984 United Kingdom .

OTHER PUBLICATIONS

Cooper et al., "Remote (Inside-Out) NMR I Remote Production of a Region of Homogeneous Magnetic Field", Journal of Magnetic Resonance, vol. 42, pp. 400-405 (1980).

Lowell J. Burnett et al., "Remote (Inside-Out) NMR II Sensitivity of NMR Detection for External Samples", Journal of Magnetic Resonance, vol. 41, pp. 406-410 (1980).

Japser A. Jackson et al., "Remote (Inside-Out) NMR III Detection of Nuclear Magnetic Resonance in a Remotely Produced Region of Homogeneous Magnetic Field", Journal of Magnetic Resonance, vol. 41, pp. 411-421 (1980).

Hutchinson, "NMR Imaging; Image Recovery Under Magnetic Fields with Large Nonuniformities":, J. Phys. E; Sci. Instrum., vol. 15, p. 1093 (1982).

Cho et al., "Chemical Shift Artifact Correction Scheme Using Echo-Time Encoding Technique", Magn. Reson., Med., vol. 2, p. 253 (1985).

Kim et al., "Chemical Shift Imaging with Large Magnetic Inhomgeneity", Mag. Reson., Med., vol. 4, p. 452 (1987).

Lai, "Reconstructing NMR Images from Projections Under Inhomogeneous Magnetic Field and Non-Linear (List continued on next page.)

*Primary Examiner*—Michael J. Tokar
*Attorney, Agent, or Firm*—Nixon & Vanderhye

[57] ABSTRACT

Extremely non-homogenous high but extremely intense high fringe magnetic fields are purposefully (and even advantageously) utilized for magnetic resonance imaging (including localization and spectroscopy) so as to better obtain advantages typically associated with ultra high field MRI. Static magnetic field gradients inherently included in such fringe fields are actively utilized in conjunction with suitable NMR RF nutation pulses so as to achieve volume-selective NMR data acquisition. Special arrangements of static electromagnets, magnetic gradient coils and/or RF coils may be used in conjunction with novel RF/gradient pulse sequences so as to elicit and acquire suitable MRI data.

49 Claims, 15 Drawing Sheets

OTHER PUBLICATIONS

Field Gradients", Phys. Med. Biol., vol. 28, No. 8, p. 925, (1983).

Sekihara et al., "Image Restoration from Non-Uniform Magnetic Field Influence for Direct Fourier NMR Imaging", Phys. Med. Biol., vol. 29, p. 15 (1984).

O'Donnell, W. Edelstein, "NMR Imaging in the Presence of Magnetic Field Inhomogeneities and Gradient Field Nonlinearities", Med. Phys., vol. 12, p. 20 (1985).

Feig et al., "Magnetic Resonance Imaging with Non-Uniform Fields", Phys. Med. Biol., vol. 31, p. 109 (1987).

FIG. 1 FRINGE FIELD (SINGLE MAGNET) IMAGING SYSTEM

Magnetic field and its gradient profile
of a conventional 4.7T 40 cm bore magnet

*FIG.3*A
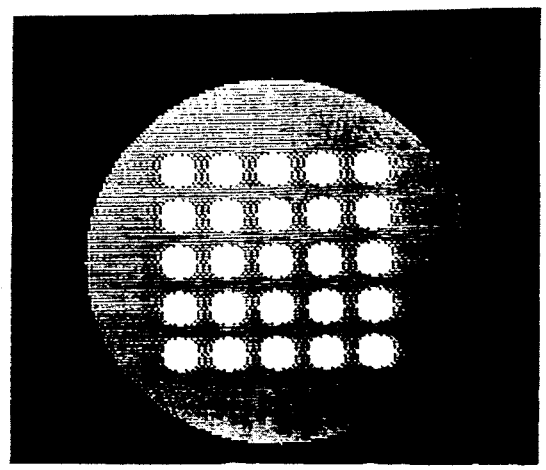
OFFSET = 5cm   G = 20 GAUSS/cm
*FIG.3*B
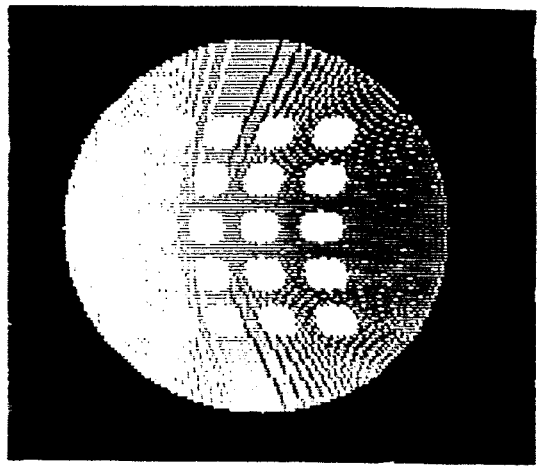
OFFSET = 12.5cm   G = 30 GAUSS/cm
*FIG.3* C
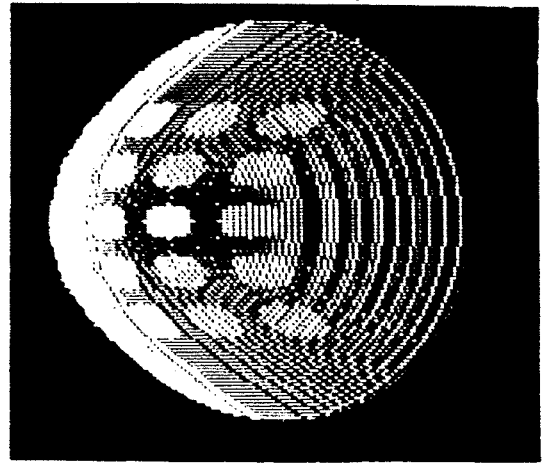
OFFSET = 17.5cm   G = 50 GAUSS/cm

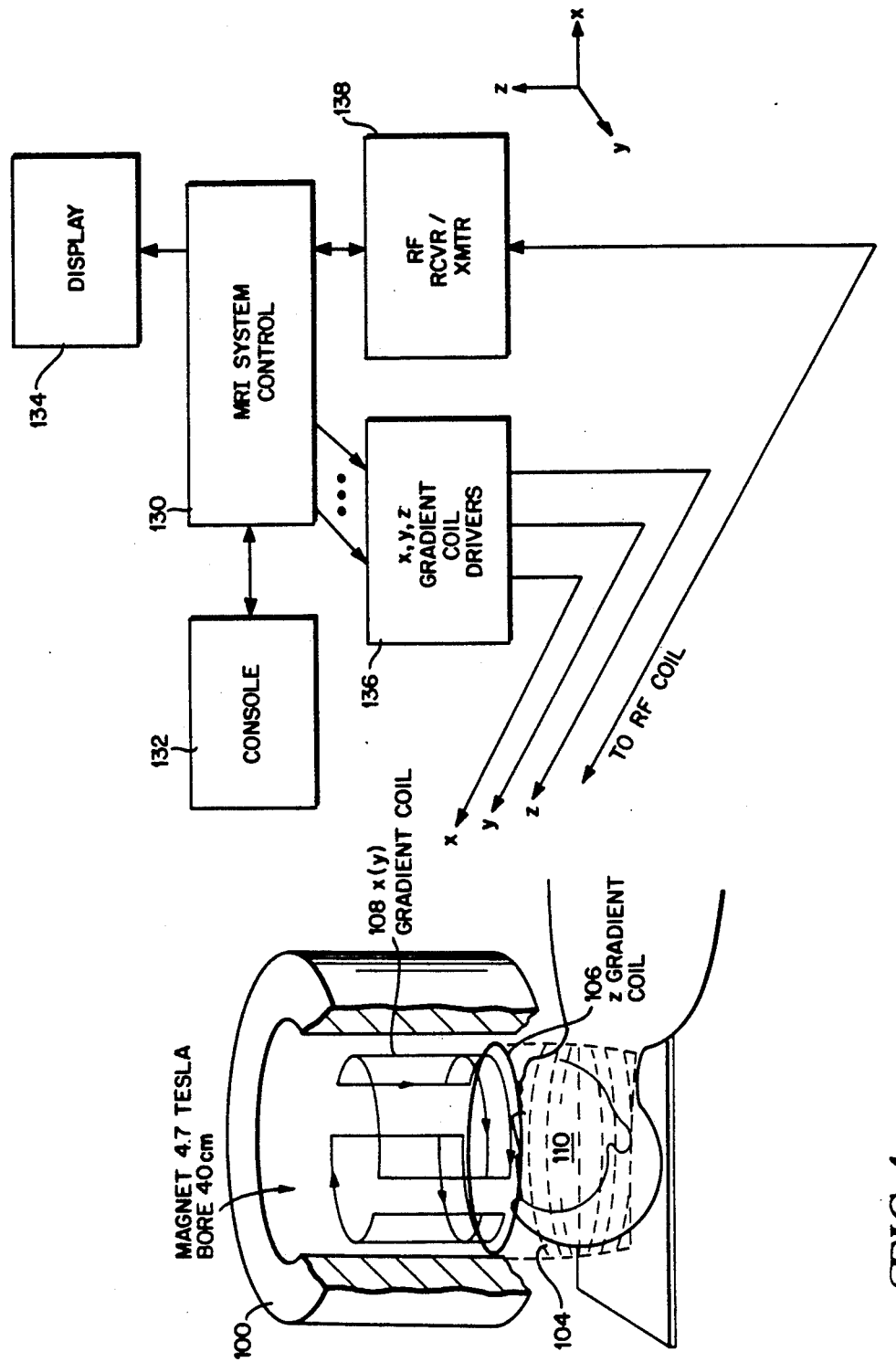
FIG. 4 FRINGE FIELD (SINGLE MAGNET OUTSIDE BORE) IMAGING SYSTEM

Fringe magnetic field and its gradient profile

*FIG. 6*A
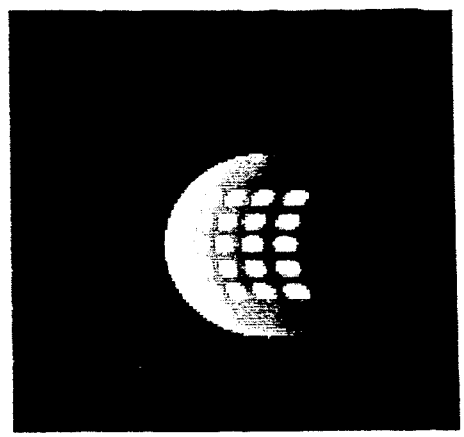
(OFFSET OUTSIDE BORE AT DISTANCE XX cm FROM END OF BORE)
OFFSET = 10cm    G = 10 GAUSS/cm
*FIG. 6*B
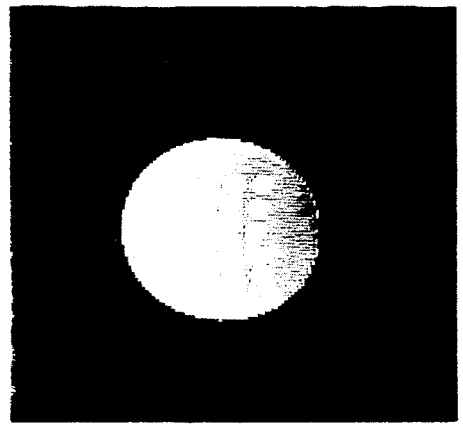
OFFSET = 10cm    G = 20 GAUSS/cm
*FIG. 6*C
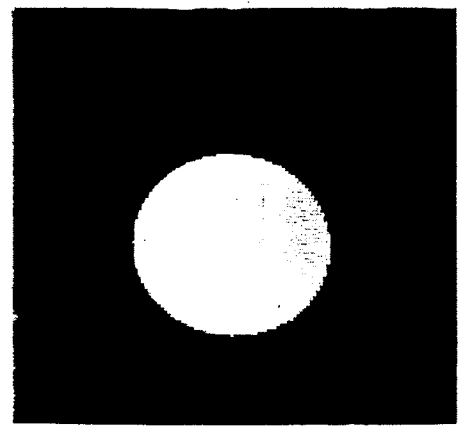
OFFSET = 10cm    G = 30 GAUSS/cm

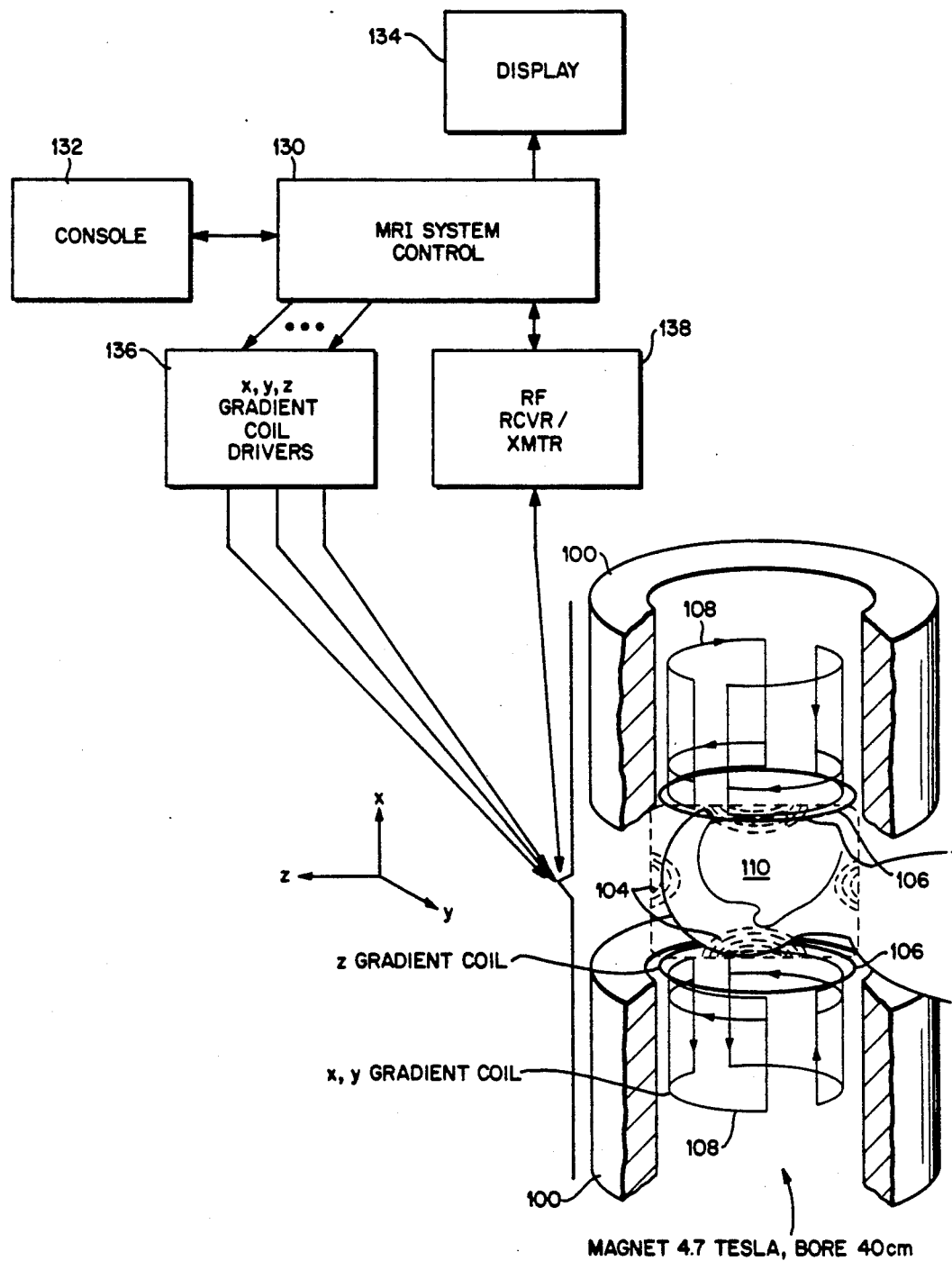
FIG. 7 FRINGE FIELD (TWO MAGNET) IMAGING SYSTEM

Fringe magnetic field and its gradient profile with two 4.7 Tesla 40 cm bore magnet in series OFFSET = 0cm   G = 10 GAUSS/cm OFFSET = 2cm   G = 20 GAUSS/cm OFFSET = 2cm   G = 30 GAUSS/cm

FIG. 10a GRADIENT COIL CONFIGURATION FOR FIG. 1 EMBODIMENT
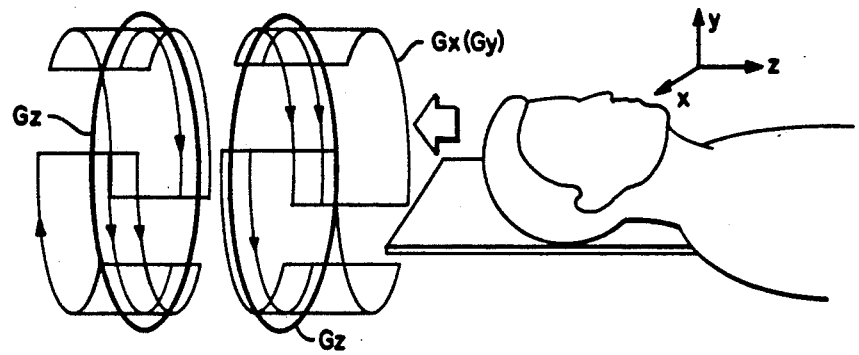
FIG. 10b GRADIENT COIL CONFIGURATION FOR FIG. 4 EMBODIMENT
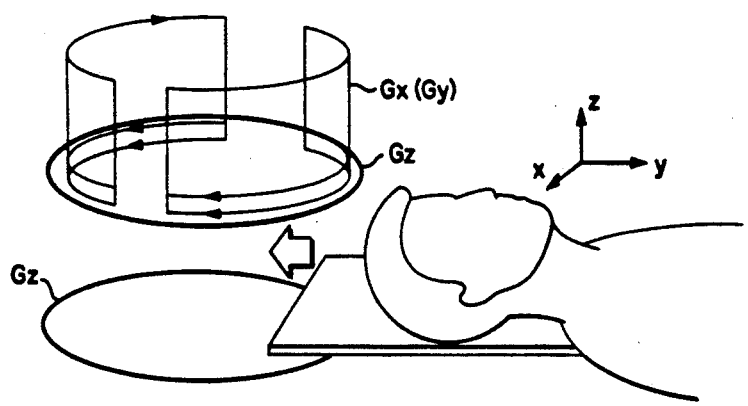
FIG. 10c GRADIENT COIL CONFIGURATION FOR FIG. 7 EMBODIMENT
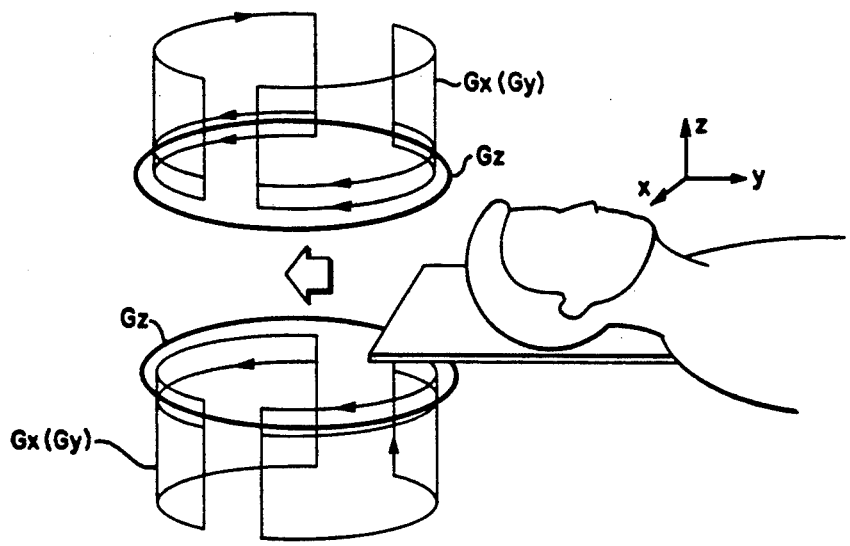

CURVED CHUNK 3-D PULSE SEQUENCE FOR FRINGE FIELD
IMAGING USING CONVENTIONAL AM RF PULSES

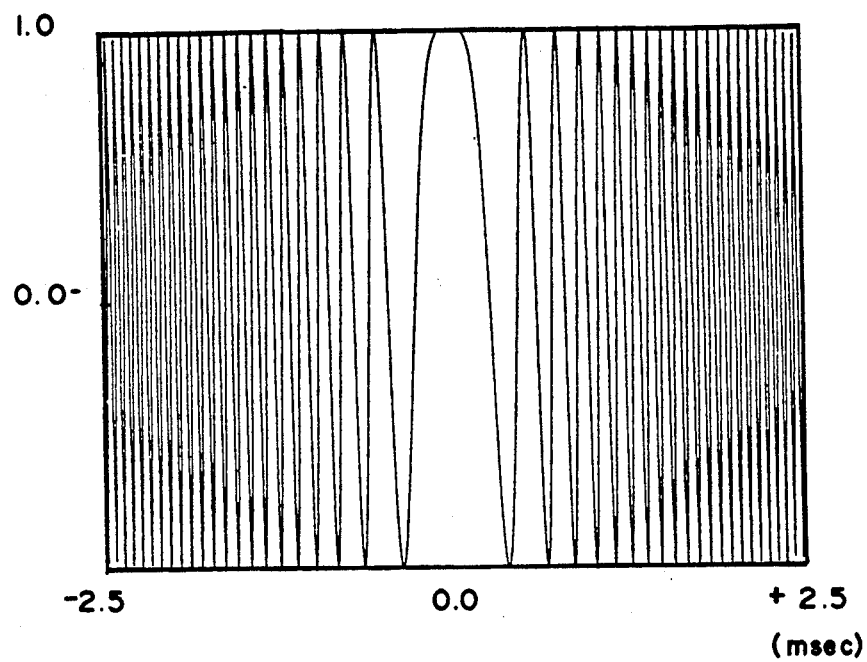
FIG.13
FIG.14
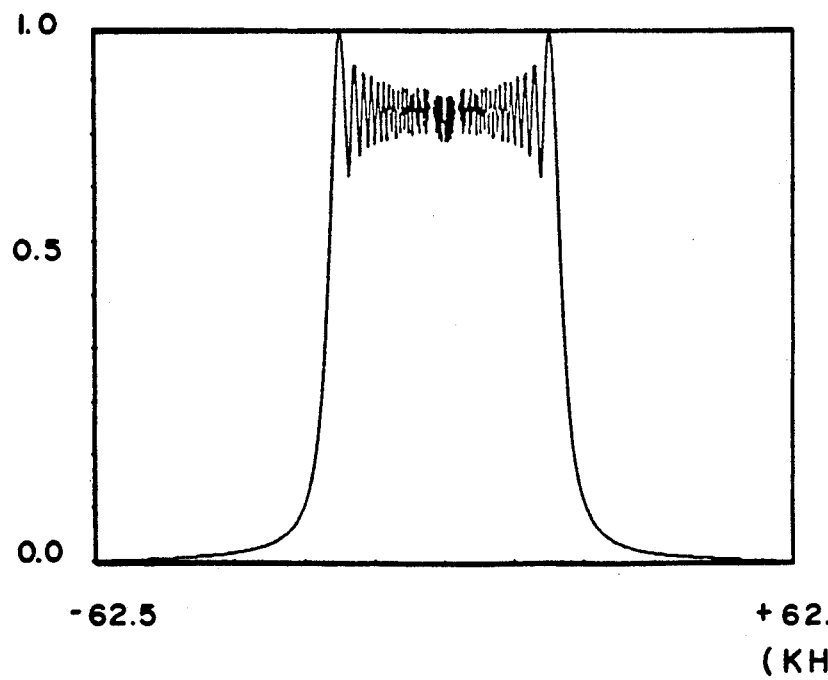

OFFSET= 20cm
BUILT-IN GRAD. = 172 G/cm

OFFSET= 25cm
BUILT-IN GRAD.= 459 G/cm

OFFSET= 35cm
BUILT-IN GRAD.= 1145 G/cm

FRINGE FIELD MRI

This invention relates generally to magnetic resonance imaging (MRI) method and apparatus utilizing nuclear magnetic resonance (NMR) phenomena (including NMR localization and spectroscopy). It is more particularly concerned with apparatus and method for satisfactory economic ultra high-field MRI (e.g., 4 Tesla and higher).

Nuclear magnetic resonance (NMR) phenomena and magnetic resonance imaging (MRI) of many different types are by now well-known in the art. There are many commercial MRI systems available and in use.

Although, there are many differences between some of these systems, all provide a fairly strong magnetic field throughout the image volume. Those nuclei having magnetic moments (i.e., those having an odd number of protons) tend to align themselves with the static magnetic field present at the nucleus site. Such orientated nuclei can be nutated (by controlled amounts) from a quiescent orientation when a radio frequency magnetic field of the proper orientation and frequency (proportional to the static magnetic field intensity at that site by the gyromagnetic constant for a given species of nuclei) in its immediate nuclear environment are applied.

Once nutated from their quiescent orientation in the static magnetic field, a population of such nuclei eventually return to their quiescent orientation giving off characteristic RF signals in the process. By applying proper magnetic field gradient pulses (and often additional RF nutation pulses) in a predetermined sequence, spatially encoded RF NMR signals can be elicited, acquired and processed so as to produce a map or "image" of the NMR nuclei populations within a given portion of the image volume (e.g., within a slice-volume).

In all presently known commercial MRI systems, extreme care is taken to obtain a static magnetic field as nearly homogenous as possible. Inhomogeneities on the order of only one part in a million or so are typical. Approximately linear gradients in this homogenous magnetic field are then super-imposed temporarily by pulse-driven gradient coils producing intensity gradients typically along three mutually orthogonal axes (x,y and z). Simultaneous application of a magnetic gradient pulse with an RF nutation pulse can then be used to obtain volume-selective nutation of NMR nuclei (as a function of the RF frequency spectrum and the applied magnetic gradient).

All known commercial NMR systems currently use such homogenous static magnetic fields having an intensity of less than 2 Tesla. A couple of recent research installations have apparently achieved 4 Tesla homogeneous MRI static magnetic fields. Some commercial static magnetic field MRI intensities are as little a 0.1 Tesla.

It has proved to be extremely expensive to design, build and maintain higher intensity magnet structures (typically cryogenic solenoids having an approximately one meter internal bore so as to accommodate a "whole body" section within the image volume). Thus, although there are some known inherent advantages associated with higher static magnetic field MRI imaging, there has been some controversy as to the proper practical and economic compromise as to static field intensity. Using clever techniques, even the lower field NMR systems can produce very good medically useful images.

Nevertheless, there remains a strong desire among many to use much higher static magnetic fields for various MRI applications. For example, where spectroscopic imaging is involved, there are often rather sparse populations of NMR nuclei for various species to be imaged. For example, in the human body, hydrogen nuclei are present in great quantities thus providing ample signal-to-noise for imaging purposes. However, when less populous (or less sensitive) NMR nuclei are to be imaged (e.g., $^{23}$Na, $^{31}$P, $^{13}$C, or $^{19}$F) higher intensity static magnetic fields are virtually required to achieve acceptable S/N. Higher resolution (e.g., microscopy down to one micron or ten micron voxel dimensions) also requires higher static magnetic fields to achieve sufficient S/N from such small voxels.

Reducing MRI image data acquisition time and reducing claustrophobic patient reactions during data acquisition are also constant goals for designing improved MRI systems.

Indeed, there is sufficient interest in higher field MRI that some in the art are making plans to construct a whole body (i.e., approximately 1 meter inside bore diameter) Deca-Tesla NMR magnet so as to produce a substantially homogenous 10 Tesla static magnetic field suitable for whole body imaging. However, it is also clear that such an undertaking, even if successful, will entail many engineering difficulties and extraordinary costs that would most likely make such a large bore ultra-high field static magnet impractical for wide spread commercial application.

At the same time, it is currently quite practical and relatively economical to make ultra-high field magnets with relatively small innerbore diameters. For example, some of the small bore magnets already commercially available can produce static field strengths as high as 14 Tesla with a bore diameter of about 10 centimeters. Other now available magnets provide a 4.7 Tesla field with a 40 centimeter bore. For relatively small image volumes, such magnets may even be quite useful in conventional MRI applications using substantially homogenous fields available within the magnet bore approximately centered between the magnet ends. However, where it is desired to perform MRI on most portions of the human body, such very small bore diameters make it impractical to locate relevant portions of living human anatomy within such a conventional image volume.

Although fringe fields located near the end of such a smaller bore magnet or outside the bore are still ultra-intense (e.g., as much as 10 Tesla or greater), such intense fringe fields are also intensely non-homogenous and therefore not heretofore considered suited for conventional MRI or spectroscopy. Nevertheless, in accordance with our invention, we now propose to actively and advantageously utilize such ultra-intense fringe fields for MRI (including spectroscopic imaging).

A search for prior art references in the U.S. Patent and Trademark Office has resulted in the following citations:

U.S. Pat. No. 4,742,303—Bendall (1988)
U.S. Pat. No. 4,740,751—Misic et al (1988)
U.S. Pat. No. 4,733,190—Dembinski (1988)
U.S. Pat. No. 4,727,327—Toyoshima et al (1988)
U.S. Pat. No. 4,721,914—Fukushima et al (1988)
U.S. Pat. No. 4,714,885—Paltiel et al (1987)
U.S. Pat. No. 4,707,664—Fehn et al (1987)

U.S. Pat. No. 4,703,270—Hall et al (1987)
U.S. Pat. No. 4,694,249—Post et al (1987)
U.S. Pat. No. 4,692,705—Hayes (1987)
U.S. Pat. No. 4,684,893—Kojima et al (1987)
U.S Pat. No. 4,684,890—Brignet et al (1987)
U.S. Pat. No. 4,680,551—O'Donnell et al (1987)
U.S. Pat. No. 4,638,252—Bradshaw (1987)
U.S. Pat. No. 4,634,980—Misic et al (1987)
U.S. Pat. No. 4,617,936—Malko (1986)
U.S. Pat. No. 4,591,789—Glover et al (1986)
U.S. Pat. No. 4,534,358—Young (1985)
U.S. Pat. No. 4,486,709—Bendall (1984)
U.K. Appln. No. 2,149,124—Bydder (1985)

Actually, most of these are of only marginal interest. For example, Bendall '303 and '709, Misic et al '751 and '989, Dembinski, Fehn et al, Hayes, Bradshaw, Malko, and Bydder all appear to relate primarily to *radio frequency* coils rather than to static magnetic field structures (which are presumably of the conventional substantially homogenous variety insofar as the MRI image volume is concerned). Similarly, Toyoshima et al, Paltiel et al, Post et al. Kojima et al. O'Donnell et al, Yamamoto et al and Glover et al all appear directed to techniques for insuring a substantially homogenous static magnetic field in the image volume and/or for compensating gradient inhomogeneities and/or directed to other features of an MRI system (again all presumably of the conventional type having substantially homogenous static magnetic fields in the image volume during an MRI imaging sequence).

Fukushima et al is more relevant in that it allegedly teaches a way to achieve sufficient homogeneity in the image volume by adding static fringe fields from two specially sized and positioned magnet coils within a single magnet. In this arrangement, the image volume is located outside any magnet structure—but it appears that a substantially homogenous static field has nevertheless been achieved within the relatively smaller image volume as well. Judging from the probable required coil radii, it appears unlikely to be suitable for high field MRI in any event.

Hall et al recognizes the conventional wisdom that it is "impossible" to achieve single quantum MRI in substantially non-homogenous static magnetic fields. Hall et al therefore teach a technique for achieving zero quantum MRI that is substantially independent of static field inhomogeneities. Hall et al also mention generation of curved "slices" so as to compensate for irregular magnetic field distributions.

Young locates an MRI image volume in a gap between opposed magnetic pole pieces. Although no mention is made as to whether the static magnetic fields within the image volume are homogenous, specially shaped pole pieces are illustrated and no steps are discussed for accommodating a substantially inhomogenous static field.

Brignet et al apparently strive for substantial cost reductions if they can practice MRI with somewhat relaxed homogeneity requirements (e.g., inhomogeneities on the order of one part in 10,000). To this end, they teach a special MRI data acquisition sequence which requires twice as much time but which permits a point-by-point calculation and compensation for inhomogeneities (presumably of this relatively small magnitude) in the static magnetic field.

In addition to Fukushima et al, there have been other attempts to achieve a substantially homogenous field *outside* a magnet structure. See, for example:

Cooper et al, "Remote (Inside-Out) NMR I Remote Production of a Region of Homogeneous Magnetic Field", Journal of Magnetic Resonance, Vol. 41, pp 400–405 (1980).
Lowell J. Burnett, et al, "Remote (Inside-Out- NMR II Sensitivity of NMR Detection for External Samples", Journal of Magnetic Resonance, Vol. 41, pp 406–410 (1980).
Jasper A. Jackson et al, "Remote (Inside-Out) NMR III Detection of Nuclear Magnetic Resonance in a Remotely Produced Region of Homogeneous Magnetic Field", Journal of Magnetic Resonance, Vol. 41, pp 411–421 (1980).

There have also been other attempts to image in an inhomogenous field and/or to correct for inhomogeneities. The following prior publications are exemplary:

Hutchinson, "NMR imaging; image recovery under magnetic fields with large nonunifomities:, J. Phys. E; Sci. Instrum. Vol. 15, p 1093 (1982).
Cho et al "Chemical shift artifact correction scheme using echo-time encoding technique", Magn. Reson, Med., Vol. 2, p 253 (1985).
Kim et al "Chemical shift imaging with large magnetic inhomgeneity", Mag. Reson, Med. Vol 4, p 452 (1987).
Glover et al, "Method for correcting image distortion due to the gradient nonuniformity" U.S. Pat. No. 4,591,789, May 27, 1986.
Lai, "Reconstructing NMR images from projections under inhomogeneous magnetic field and non-linear field gradients", Phys. Med. Biol., Vol. 28, No. 8, p 925, (1983).
Sekihara et al, "Image restoration from non-uniform magnetic field influence for direct Fourier NMR imaging", Phys. Med. Biol., Vol. 29, p 15 (1984).
O'Donnell, W. Edelstein, "NMR imaging in the presence of magnetic field inhomogeneities and gradient field nonlinearities", Med. Phys. Vol. 12, p 20 (1985).
Feig et al, "Magnetic resonance imaging with non-uniform fields", Phys. Med. Biol., Vol. 31, p 109 (1987).

As previously noted, in conventional commercial MRI magnet only the most homogenous central region (where the magnetic field is also of highest intensity) has been considered useful for NMR imaging and spectroscopy. Conventional MRI imaging sequences become increasingly more difficult to successfully implement when the image volume is moved away from this central region of substantially homogenous static magnetic fields. For example, gradients inherent in large scale inhomogeneities are typically much too large for control by conventional super-imposed magnetic field gradient pulses (typically of intensity less than 2 Gauss per centimeter).

Although proposals for imaging with substantially inhomogenous fields have been considered by others, they generally have also been regarded as unfavorable for commercially useful imaging purposes. Even the published correction techniques for supposedly overcoming (at least in part) some field inhomogeneity have never proposed to actively seek out and use ultra-high intense and ultra inhomogeneous fringe fields for NMR purposes.

So as to clearly distinguish from relatively slight inhomogeneities utilized in prior MRI image volumes (including those located outside magnet structures) we will use the term "fringe" field or "fringe magnetic" field to mean only ultra-intense static magnetic fields of 2 Tesla or greater and having characteristic static magnetic gradients of substantially more than 2 Gauss per centimeter within the image volume (e.g., typically considerably greater than 10 Gauss per centimeter).

Such fringe magnetic fields are generated in the exemplary embodiments of this invention in several ways. For example, they may be located *within* a magnet bore (in an image volume disposed off center or even proximate one end of the magnet). Such fringe magnetic fields may also be generated *outside* the magnet bore: (a) proximate one end of a single magnet or (b) in an image volume disposed between spaced-apart ends of a pair of magnets. As will be appreciated, the embodiments utilizing fringe magnetic fields located outside the magnet bore are especially useful when smaller bore magnets (e.g., 10 cm) are employed.

In the exemplary embodiments, the inherent static magnetic gradient of such inhomogenous static fringe fields may itself be advantageously utilized (in conjunction with a suitable NMR RF pulse) to achieve volume-selective NMR nutation of nuclei within the image volume. In this manner, one of the supposed disadvantages of static field inhomogeneity is utilized to advantage.

To create needed magnetic gradients, some exemplary embodiments employ asymmetric gradient coil structures to interact with asymmetric static fringe field gradients.

Special frequency modulated NMR RF nutation pulses are also employed in some exemplary MRI sequences utilizing the fringe magnetic fields. In this manner, even though extremely strong static gradients are necessarily utilized for volume selective NMR nutations, desired sub-volume sizes can nevertheless be defined via a relatively wider range of frequencies available through a frequency modulated nutation pulse.

For general use, we propose fringe field imaging to provide both imaging of protons as well as multi-nuclear human brain imaging (and cardiovascular, liver, abdominal organs, etc). Imaging will be performed out of the central region of the magnet and the field inhomogeneity will be utilized for imaging using special gradient coils and imaging methods. With the proposed system, in-vivo multi-nuclear human brain imaging is possible together with in-vivo spectroscopic imaging and localized spectroscopy. In addition to the above spectroscopic imaging with unprecedented resolution, human in-vivo functional study based on tissue diffusion and perfusion, in vivo human ocular imaging will also be performed with substantially improved sensitivity and resolution.

This invention provides new high resolution MRI imaging using fringe magnetic fields with particular application to clinical microscopic imaging. It will enable one to visualize many human organs "in vivo" with an unprecedented high field close to 10 Tesla or more. As it is known, the highest field available commercially for whole body MRI is 1.5–2.0 Tesla (only recently two research stage magnets are available up to 4.0 Tesla). Recent development of ultra-high resolution or microscopic imaging as well as chemical spectroscopic imaging, however, requires even higher static field to partially compensate for sensitivity loss due to improved resolution and/or the substantially reduced NMR sensitivity of many interesting nuclei other than protons, e.g., $^{23}$Na and $^{31}$P.

This new fringe field imaging will provide an approach to ultra-high field human in vivo NMR or MR imaging with relatively small bore size magnets. This will then enable pursuit of human in-vivo imaging with resolution as high as several microns in proton imaging and also higher resolution localized spectroscopy $^{31}$P than was before available with a whole body magnet. The fringe field MRI system is specifically directed to the use of commercially available high field magnets such as a 14.1 Tesla 10 cm bore magnet or a 4.7 Tesla 40 cm bore magnet with newly designed asymmetric gradient coils suitable for fringe field imaging together with new inhomogeneity corrected fringe field imaging pulse sequences and associated image processing algorithms.

Some examples of potential uses for our new fringe field MRI are:

(a) Tissues and cellular elements of the visual system have their own unique anatomical and physiological characteristics which can be used to identify normal and abnormal states. The image provides anatomical information. Biochemical assessments of the metabolic function of organs and tissues can be obtained by spectroscopic imaging of nuclei involved in metabolic processes by magnetic resonance imaging.

(b) The study of a developing cataract can be achieved with NMR before any visible changes are seen on Hochwin camera images. With the new system, one will be able to image and study biochemically the development of reversal of cataracts in the human subject in-vivo. Moreover, this will be possible with definition down to several microns, i.e., the cellular and sub-cellular level.

(c) Other diseases of the visual system can be studied. The optic nerve is often the target of neurological diseases such as multiple sclerosis. With our new fringe field imaging, one will be able to study biochemical and structural changes of the optic nerve during evolution of blindness and recovery from optic neuritis during attacks of multiple sclerosis. Certain medications can lead to blindness as a side effect. The optic neuropathy of chloroquine toxicity can be elucidated with the molecular and structural information obtained with this new approach to NMR.

(d) In testing for new therapies in glaucoma, one will be able to image and study biochemically the effect of medications on the ciliary body, the iris, Schlemm's canal, the trabecular meshwork, and the outflow channels. Thus, one will have a new and dynamic approach to understanding and treating a major disease of the eye.

(e) Macular degeneration, a major cause of blindness in the elderly, can be studied at the circulatory level, the erythrocyte level, and at the sub-cellular level in order to understand and thereby prevent the blindness of this difficult to manage disease. Diabetic retinopathy, a major cause of blindness in our country, can be better understood. By understanding the pathogenesis of disease, medical science is always better able to attempt new therapies.

This invention provides a new approach to NMR which should create a revolution in the understanding and anatomic monitoring of disease in the visual system. The clinical and research applications of this new modality should make it invaluable to every major eye center in the world.

In using current NMR technology, one finds that patients are reluctant to lie still for the one hour necessary to image their disease. Moreover, the claustrophobia created by lying still inside a narrow cylindrical tube will often cause patients to abort the study or refuse a second study which may be necessary. Children have to be put under anesthesia in order to obtain a decent image!

Fringe field NMR imaging will eliminate these problems. In preferred embodiments, the patient is not lying inside the cylinder, rather, the cylinder is above and away from the patient. This approach to imaging with NMR should eventually be adopted by other fields of medicine (especially where the area to be studied is within 1.5 inches from the surface of the body).

These as well as other objects and advantages of our inventions will be more completely appreciated and understood by careful study of the following detailed description of presently preferred exemplary embodiments taken in conjunction with the accompanying drawings, of which:

FIGS. 3A, 3B and 3C are simulated images for a 4.7 Tesla imaging magnet having a 40 centimeter bore diameter, the images being taken at three different offset positions from the center of the magnet along the z-axis and with different strengths of imposed magnetic gradient field pulses during the simulated imaging;

FIG. 4 illustrates another single magnet embodiment with the fringe field imaging volume located *outside* but proximate the end of a single magnet;

Figure 1:
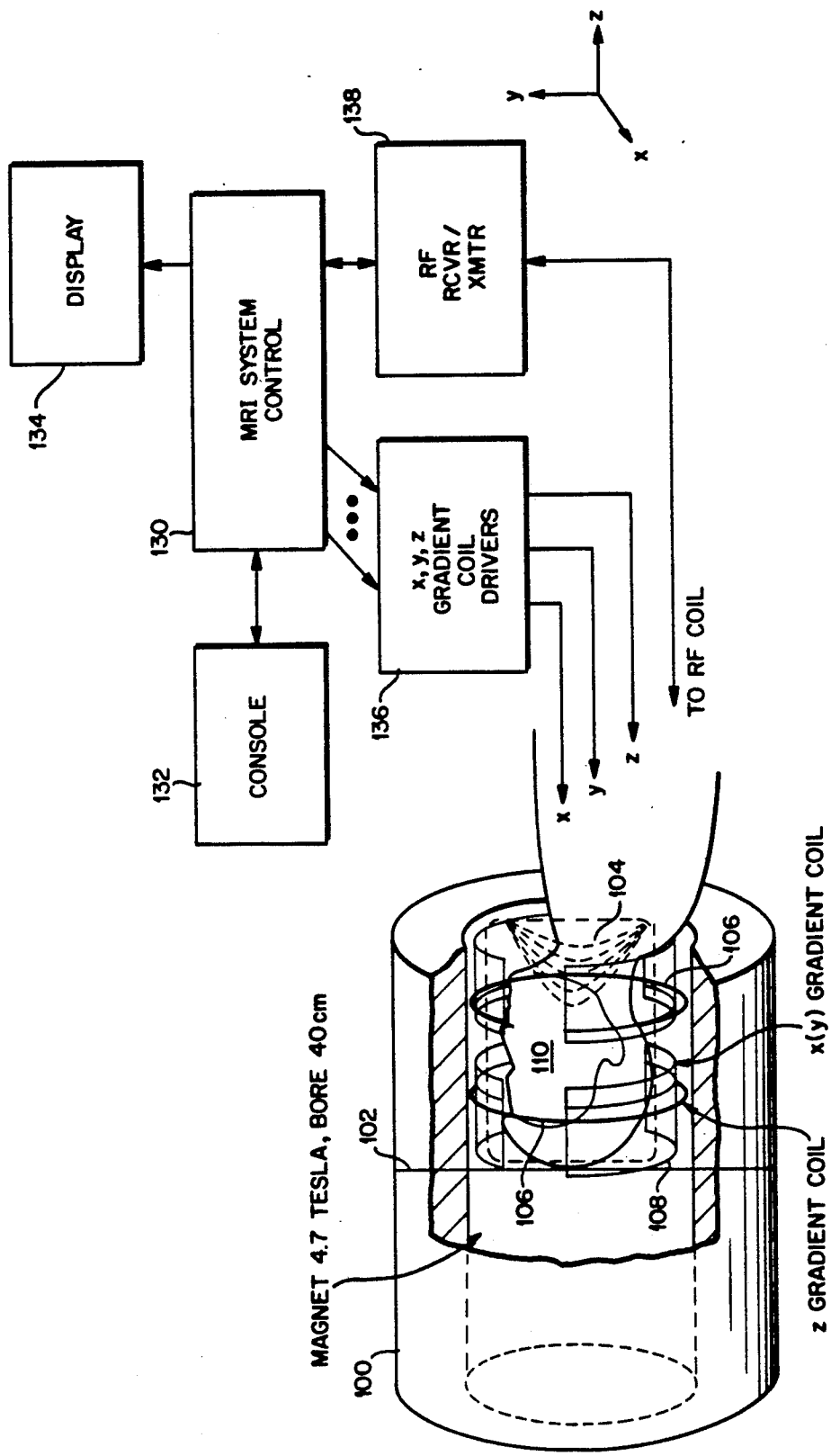
FIG. 1 is a schematic diagram of a single magnet fringe field MRI system utilizing the fringe field asymmetrically located within the magnet bore.
Figure 8:
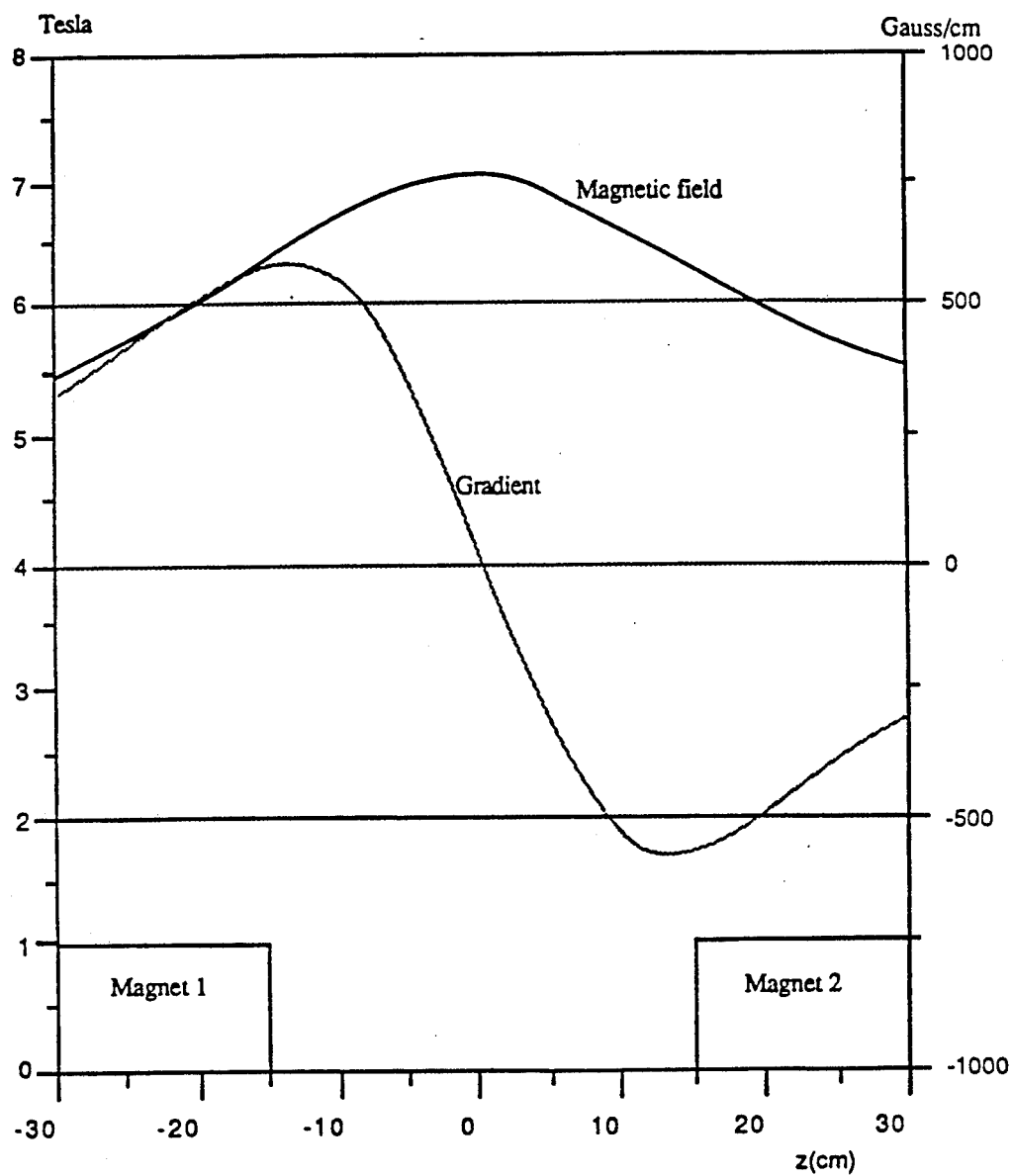
Figure 9A:
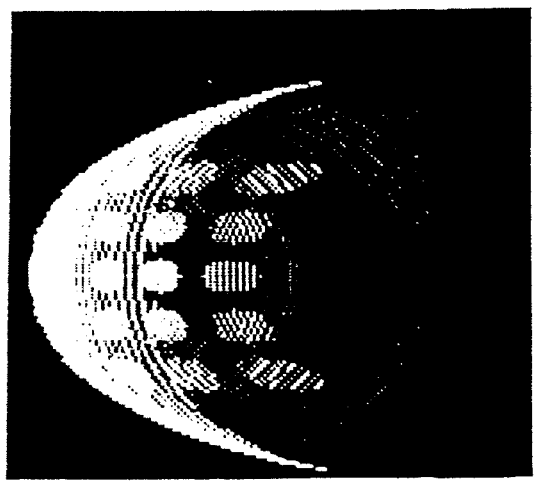
Figure 9B:
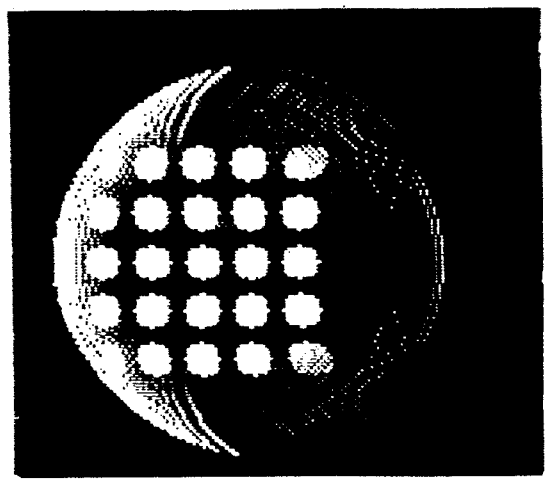
Figure 9C:
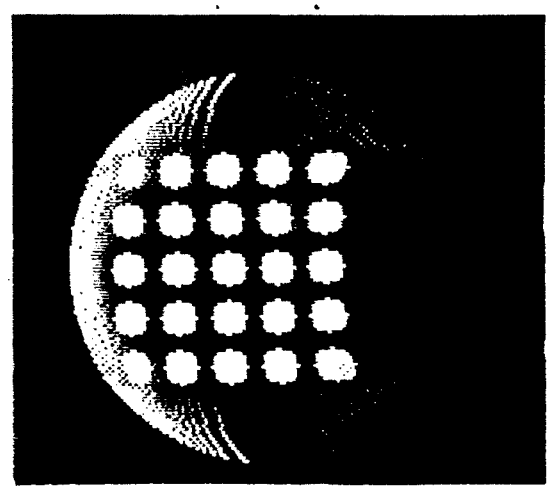
Figure 11:
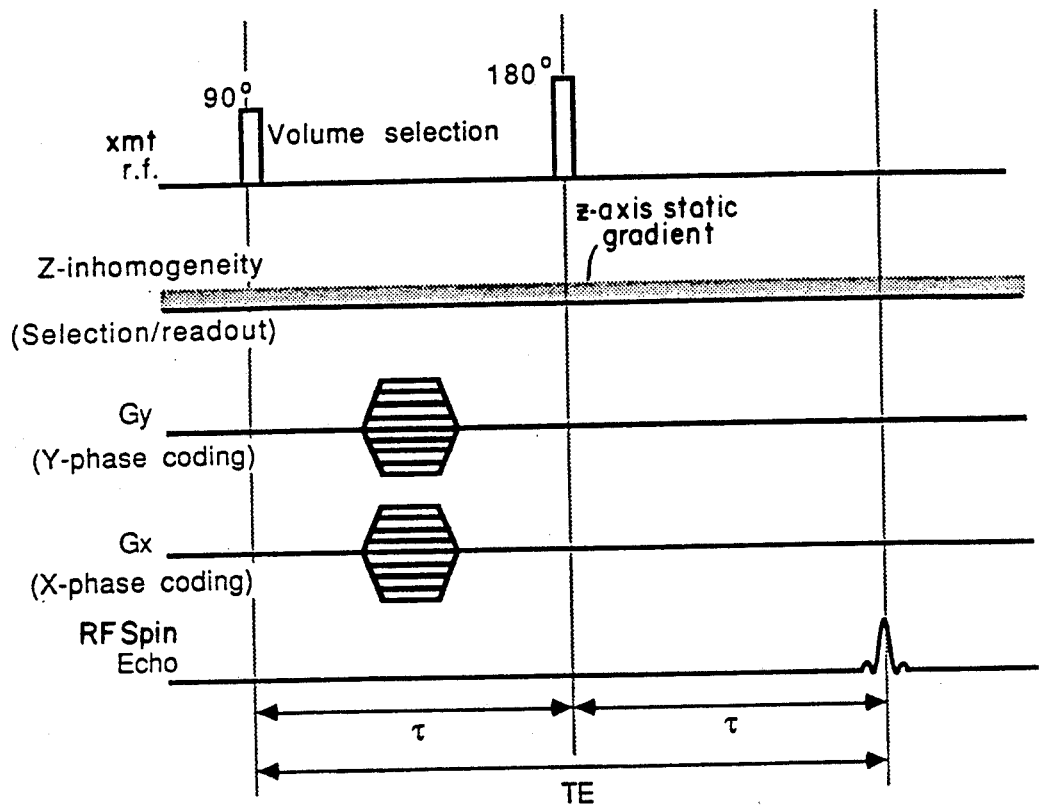
Figure 12:
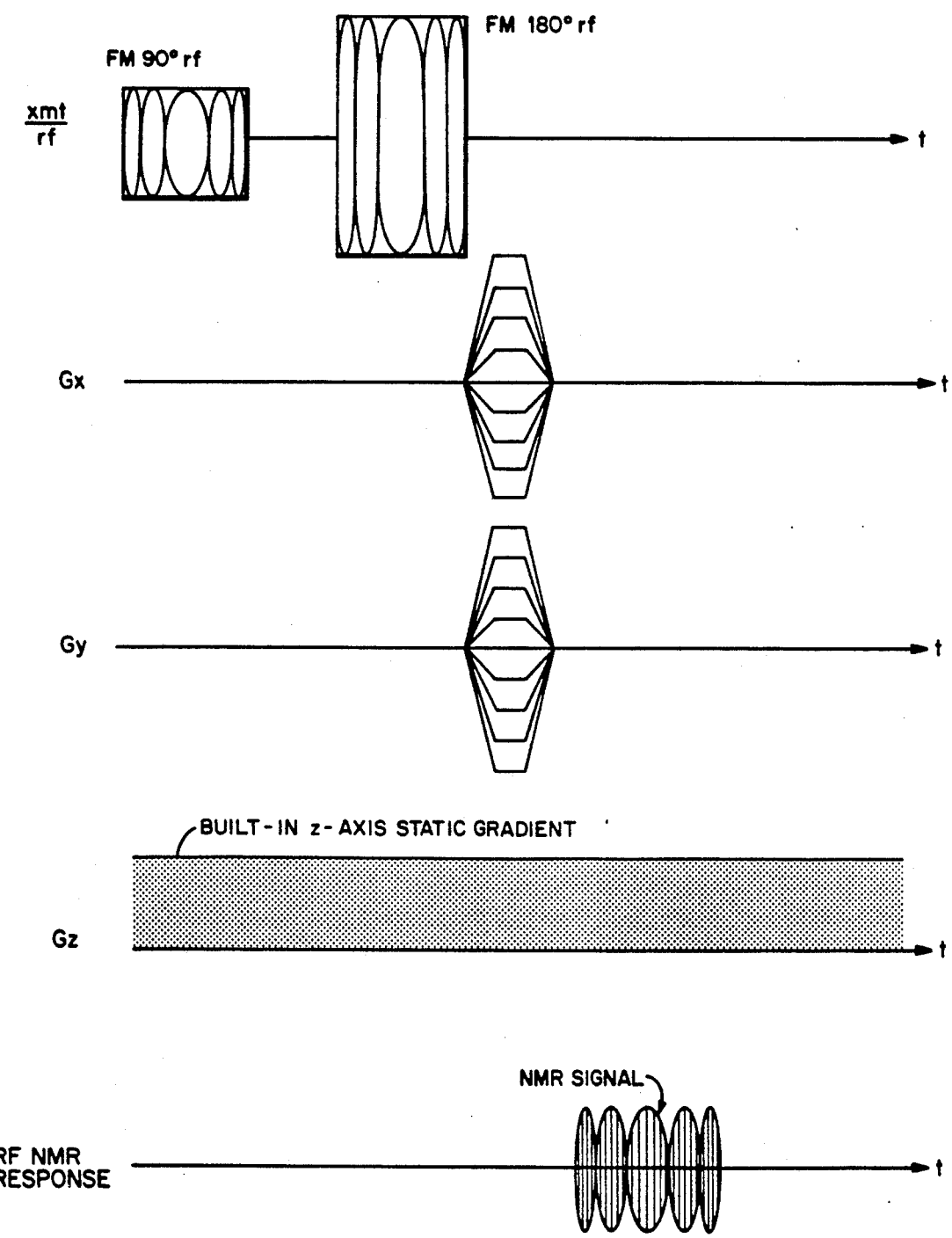
Figure 15A:
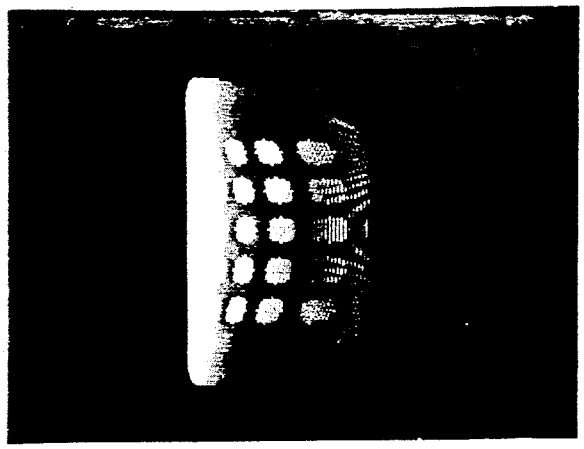
Figure 15B:
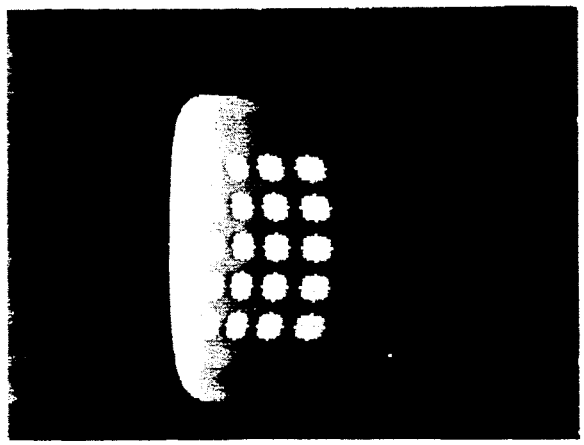
Figure 15C:
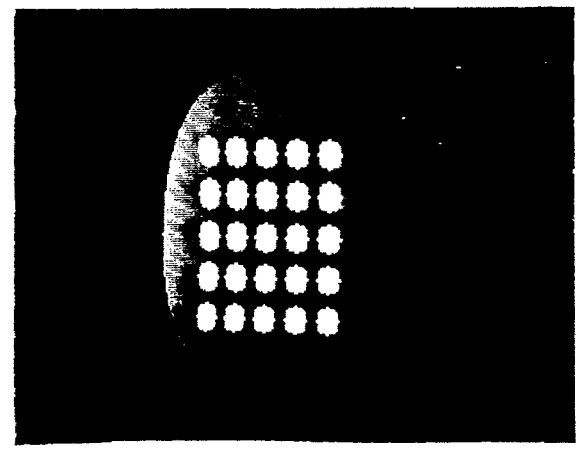
Figure 16:
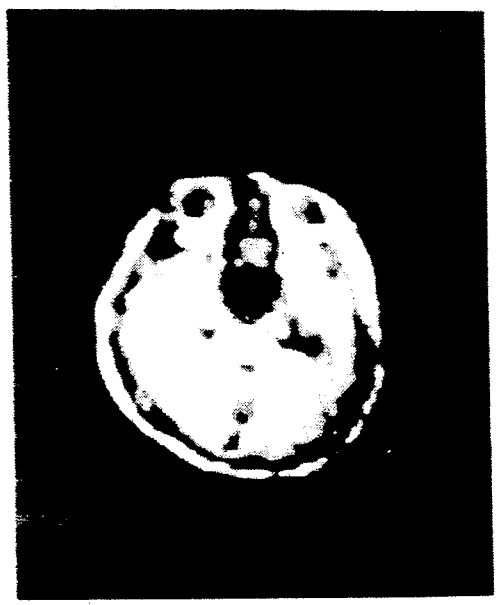

FIGS. 6A, 6B and 6C are photographs of a simulated small image volume using a small bore single magnet fringe field of the type depicted in FIG. 4 (the selected transverse image area being 2 centimeters by 2 centimeters located at a distance 10 centimeters away from the end of the magnet, the three images being constructed using different simulated magnetic gradient field pulse strengths of 10, 20 and 30 Gauss per centimeter, respectively);

FIG. 7 depicts yet another fringe field image volume, this one located in the open space between the ends of two spaced-apart magnets;

FIG. 8 is a graph of the magnetic field and its associated gradient for a two-magnet embodiment of the FIG. 7 type assuming that each magnet is a 4.7 Tesla magnet having a 40 centimeter bore;

FIG. 9A, 9B and 9C are simulated images obtained with the center of the image volume located between the two magnets of FIG. 7 using several different indicated magnetic gradient field pulse strengths;

FIG. 10A, 10B and 10C depict three types of gradient coil structures suitable for use in the embodiments of FIG. 1 (within the end of a single magnet bore), FIG. 4 (outside the end of a single magnet bore) and FIG. 7 (between the ends of a pair of spaced-apart magnet bores), respectively;

FIG. 11 is a fringe field imaging pulse sequence for chunk-3D acquisition with the built-in gradient used for volume selection as well as frequency encoding (readout) and an applied RF pulse being a conventional amplitude modulated (AM) sinc function with a suitable bandwidth;

FIG. 12 is a frequency modulation (FM) version of chunk-3D technique with the built-in gradient again used for volume selection and frequency encoding but with the FM RF pulse, bandwidth of the RF pulse is easily expanded without increasing RF power (in AM RF pulse, power increases as a function of square of the bandwidth) where the FM chunk 3-D technique will be used in the case that the built-in gradient is relatively large, while the AM version of FIG. 11 will be used in the situation where the built-in gradient is relatively small;

FIG. 13 depicts in more detail an FM-modulated RF pulse (of the type used in FIG. 12) in the time domain;

FIG. 14 depicts the frequency spectrum of the FM-modulated pulse shown in FIG. 13;

FIG. 15A, 15B and 15C are a set of simulated images with chunk-3D technique shown in FIG. 12, with the built-in gradient used for slice selection and readout gradient for 4.7 Tesla 40 cm bore magnet, sagittal images are obtained at (a) off-set=20 cm, (b) offset=25 cm, (c) offset=35 cm, respectively, wherein, due to the improved linearity of the built-in gradient, an image reconstructed at a larger offset shows less distortion, although the strength of the built-in gradient is proportionally large; and FIG. 16 is an actual MRI image obtained using the pulse sequence of FIG. 12 in an extremely inhomogeneous region of a 2 Tesla magnet where conventional MRI is normally considered impractical.

For considering fringe field imaging, static magnetic fields may be classified into three regions depending on the spatial current distribution:

(a) fringe magnetic fields at an out-of-magnet region (i.e., all the magnet currents are distributed to either the right side or the left side of the region), (b) fringe magnetic fields in between the out-of-magnet region and a central region (i.e., highly inhomogeneous but not as high as outside the bore of the magnet and built-in gradient fields are unsymmetrically distributed), and (c) central fields (i.e., a region at the center of two magnets).

For high resolution and high contrast NMR imaging, the magnetic field at the image volume in which a sample is located should be sufficiently high, yet undesirable inhomogeneity should be low enough to be suppressed by either external gradient field pulses or restoration processing after data acquisition.

Calculations based on Biot Savart's law show that the *outside* bore fringe fields are the most inhomogeneous for reasonably sized relatively small bore magnets as would be required for ultra high static field generation.

As might be expected, similar calculations for small volumes near the magnet center show substantial homogeneity. However, for off-center *inside* bore fringe fields, the behavior of the field is more dependent on coil structures. By numerical calculation for a 4.7 Tesla, 40 cm bore magnet of a simple 4 coil geometry, a possible image volume having a static gradient of less than 10 Gauss per centimeter turns out to be fairly wide.

A 4.7 Tesla split core magnet with 30 cm central gap is under development. Due to the open sample access inherent in such a design, not only human head imaging but also whole body imaging may be possible at 4.7 Tesla. Computer simulation shows that a region about 8.0 cm has a static gradient less than 10 Gauss/cm and an about 3.9 cm diameter volume has a gradient less than 1 (Gauss/cm) with a 30 cm gap. Although the image volume region in such a split core magnet has much reduced homogeneity compared to conventional MRI magnets, it provides a unique capability of whole body imaging at ultra high fields using techniques to be discussed in detail below.

Fringe field imaging *within* the bore at an off-center location has already been mentioned, an image volume can be extended as large as 25 cm (having static gradient less than 10 Gauss/cm), which is believed suitable for head imaging alone even if the head is not placed at the magnet center and using the proposed pulse sequences.

Figure 2:
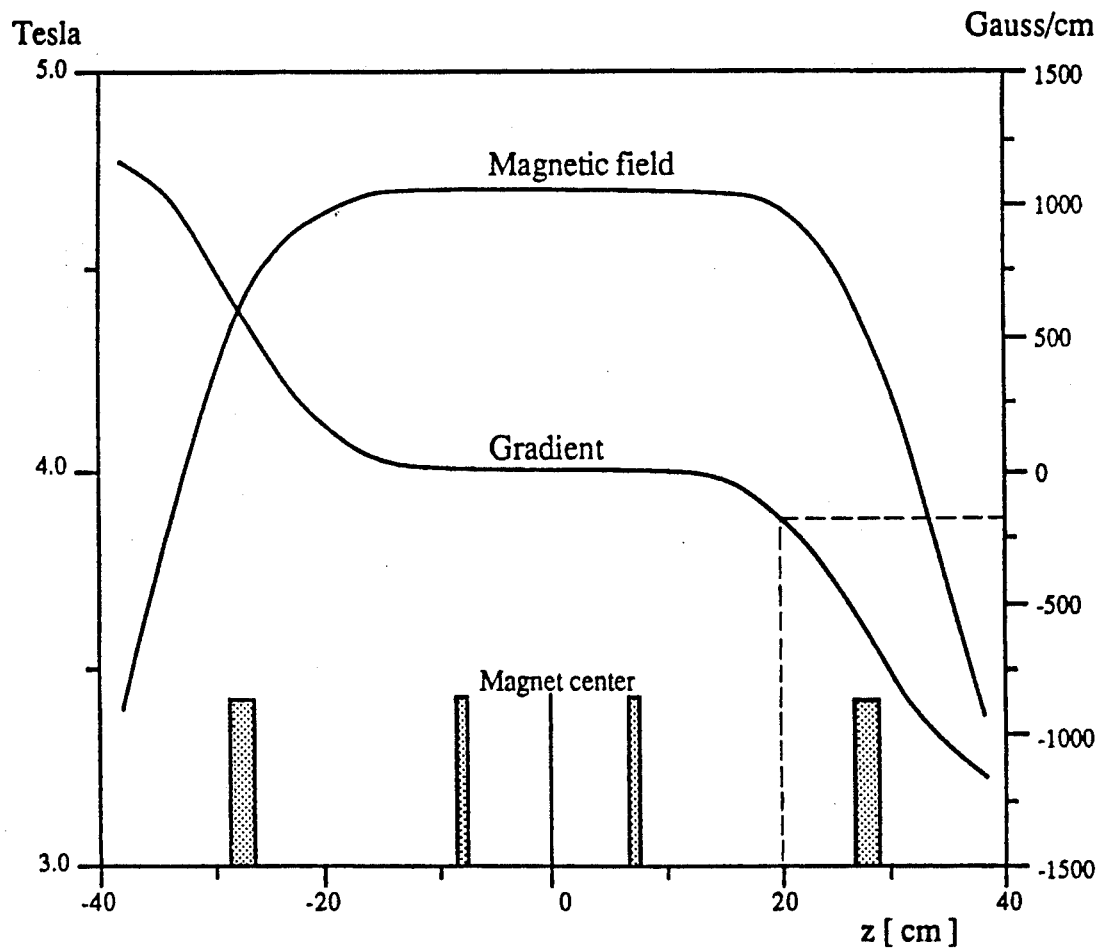
FIG. 2 is a graphical plot of the magnetic field and gradient as a function of position along the magnet bore for the magnet of FIG. 1.

FIGS. 1-3 relate to an exemplary embodiment using the fringe field located *within* a magnet bore. Where the relatively small bore diameter can still accommodate the relevant portion of a patient (e.g., a human head), this may be the most simple and economical approach to fringe field human in-vivo NMR imaging or spectroscopy. Of course, the magnet bore diameter must still be reasonably large so that part of human body such as a a human head might be placed inside the bore with all necessary gradient and RF coils.

In this case, conventional MRI gradient coils and RF coils can be used provided that sufficiently increased intensity driving currents are supplied to the gradient coils (and provided that construction of the gradient coils is suitably robust as to handle the increased currents and fields). MRI data acquisition and image reconstruction algorithms would require either correction for inhomogeneity (see the above prior art publications) or would result in the imaging of curved "slices" conforming to the general three-dimensional shape of the strong gradients included in the fringe fields. Frequency modulated RF pulses and more intense magnetic gradient pulses would also typically be required.

For example, a 4.7 Tesla magnet 100 having a bore diameter of 40 centimeters is depicted in FIG. 1. Although a relatively homogenous static magnetic field is created near the center of the bore in the neighborhood of the magnet center line 102, the normal size of human anatomy prevents location of the MRI image volume within this preferred homogenous field.

Instead, the image volume is located at one end of the bore in the fringe field where strong magnetic gradients (e.g., much greater than 10 Gauss per centimeter) can be expected as indicated by iso-intensity lines 104. A conventionally configured z-gradient coil 106 together with conventionally configured x-gradient coils 108 surround the MRI image volume in which a human head has been placed proximate the end of the magnet bore. A similar set of y-gradient coils is also used (but rotated by 90° about the bore axis with respect to the x-gradient coils). These are not explicitly shown in FIG. 1 (nor any of the other FIGURES for other embodiments) so as to reduce drawing clutter.

As in any conventional MRI system, there is a suitably programmed computer control 130 interfacing with a control console 132, video display 134, x,y,z gradient coil drivers 136 and radio frequency receiver/transmitter circuits 138. The latter circuits are also connected to a conventional RF transmit/receive coil (not shown) coupled to the image volume 110. In some implementations, separate transmit and receive RF coils may be employed.

Those in the art will understand that magnet 100 is typically a cryogenic super-conducting solenoidal electromagnet.

A graph of the magnetic field along the z-axis (the bore center line), of magnet 100 is plotted in FIG. 2. The gradient associated with this magnetic field is also plotted. As may be seen, truly homogenous static magnetic fields only exist in the center portion of the bore. However, the inhomogeneities within plus or minus 20 centimeters of the magnet center have sufficiently small built-in gradient that they might be controlled by conventionally configured magnetic gradient coils robustly constructed to handle larger currents and fields (and driven by similar robustly designed coil driving circuits capable of handling higher current levels required to off-set the inherent built-in gradients of the fringe fields). In this manner, it is believed possible to image near the edge of the magnet bore (i.e., the entrance of the bore) using imaging techniques that are otherwise similar to conventional MRI (e.g., except for increased gradient fields, especially in the x and y dimensions and increased bandwidth RF nutation pulses). As will also be appreciated, suitably restricting the image volume may provide yet another way of imaging in a substantially non-uniform or inhomogenous static field while requiring magnetic gradient pulses of somewhat lower magnitudes (e.g., to counteract the relatively weaker range of gradients encountered in a smaller volume).

FIGS. 3A, 3B and 3C illustrate possible fringe field imaging with currently available magnets. These simulated images are based on use of an assumed 4.7 Tesla imaging magnet of b 40 centimeter bore diameter (which is close to those commercially available, e.g., Oxford type 200/400). The simulated images depicted at FIGS. 3A, 3B and 3C are respectively associated with three different off-set positions along the z-axis from the magnet center. In the image simulation, different magnitudes of gradient pulses were assumed. For example, for an off-set of 5 centimeters (FIG. 3A), the intensity of simulated magnetic gradient pulses during the imaging sequence was 20 Gauss per centimeter. For an assumed off-set of 12.5 centimeters (FIG. 3B), a stronger magnetic gradient pulse intensity of 30 Gauss per centimeter was simulated. For the more extreme off-set of 17.5 centimeters (FIG. 3C), a much stronger magnetic gradient pulse intensity of 50 Gauss per centimeter was simulated.

The images shown in FIGS. 3A-3C are axial "slices" and distortions in the assumed read gradient direction (the x-dimension as shown), graphically demonstrate the effect of increasing field inhomogeneity and the inherent intense "built-in" gradients associated with such inhomogeneities. Although there are already a number of techniques proposed for compensating or correcting inhomogeneity effects (see the above referenced prior art), we propose to advantageously utilize some of the fringe field inhomogeneity. In particular, we propose to advantageously utilize the inherently strongest built-in z-axis gradient associated with the fringe field inhomogeneity so as to achieve volume-selective MRI data acquisition.

Yet another of our techniques for advantageously utilizing some of the inhomogeneity of fringe fields is to use a curved-plane imaging technique currently under further development. With this technique, instead of attempting to achieve planar "slices" for images, the naturally curved "slices" (which result from built-in three dimensional gradients of the fringe fields) will be utilized. If properly interpreted, images of such curved or cupped "slices" may be just as valuable for diagnostic purposes as currently accepted planar slices. Indeed, since many of the human organs or other parts of the anatomy include complex three-dimensional shapes, the ability to image a curved "slice" may actually prove to be more advantageous than a straight or rectilinear "slice."

Figure 5:
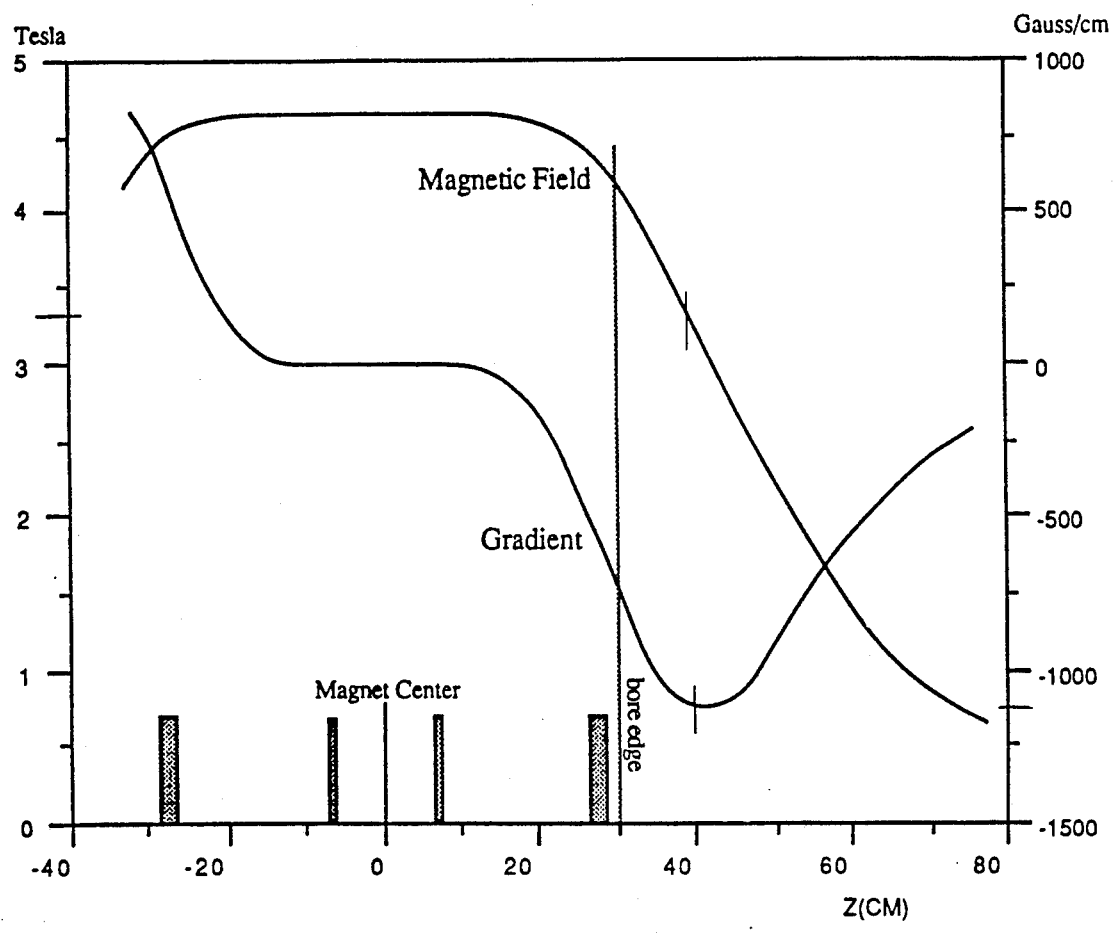
FIG. 5 is a graph depicting the magnetic field and its gradient with respect to distance along the magnet bore (including locations outside the bore) for the magnet of FIG. 4.

FIGS. 4–6 depict another exemplary embodiment wherein fringe fields *outside* the magnetic bore are utilized for the image volume. Similar reference numerals are used to depict similar parts in FIG. 4.

Although FIG. 4 also depicts a 40 centimeter bore, the most interesting and attractive approaches to truly high intensity fringe field MRI and spectroscopy may be the use of single even smaller bore magnets (e.g., 14 Tesla, 10 cm bore). Using the fringe field at the bore entrance such that a small image volume in that region can be created without physically inserting the whole body into the magnet bore (or even any part of it) would eliminate the necessity of making the magnet bores sufficiently large to accommodate the size of objects to be imaged (e.g., which is the current commercial design philosophy of today's whole body NMR scanners having a one meter bore diameter).

When using fringe fields outside the magnet bore, the actual static field strength does of course decrease as a function of increasing distance with respect to the bore entrance. Furthermore, the expected field inhomogeneities (including their intense "built-in" static gradients) can also be expected to increase outside the magnet bore.

FIG. 4 illustrates an image volume 110 located in the fringe field pattern 104 formed by the small bore single magnet 100. Although the field strength does drop outside the bore, the static field strength at a distance of approximately 15 centimeters from the bore entrance is still at least about 70% of the maximum central field intensity (e.g., see the magnetic field plots of FIG. 5). Thus, a still ultra-intense static magnetic field can be provided outside the bore of even a single magnet 100.

In FIG. 5, the inherent "built-in" static gradient field is plotted as a function of distance from the center of the magnet along the z-axis (i.e., along the bore center line). As illustrated, at a distance of 50 centimeters away from the entrance, although the static magnetic field intensity is still very high (e.g, 70% of its maximum), the inherent or "built-in" static magnetic gradient can be as much as 1,000 Gauss per centimeter. Since conventional magnetic gradient field coils are designed to generate gradients of typically less than 2 Gauss per centimeter, this is well beyond anything that could be managed by conventional MRI spectroscopy. Perhaps the most difficult part of imaging in such intense fringe fields is accounting for the inhomogeneity in the form of built-in gradient fields, especially along the z-axis direction.

However, by accepting an extremely thin image "slice" or other shape of small image volume, it is believed possible to nevertheless achieve usable imaging. Such reduction of the image volume or slice thickness can still be achieved by application of a narrow RF pulse for volume-selective NMR nutation in the z-axis dimension. Using typical amplitude modulated RF pulses, a wide pulse width implies a narrow frequency bandwidth while a narrow pulse width means a wider frequency bandwidth (therefore, selects a reasonably thick "slice" along the z-axis dimension. Finite power requirement with conventionally used AM narrow pulse width RF for the selection under the strong built-in gradient, is handled by using a FM pulse sequence as shown in FIG. 12. Although the images obtained will be distorted or parabolically curved (i.e., following the three-dimensional built-in" static gradient pattern), they may still be of diagnostic value for reasons previously noted.

At the same time, even if one can be satisfied with images of curved "slices," the built-in static gradients are so enormous that they will also require extremely robust x and y gradient field coils and coil drivers. One way to circumvent this problem area is to select a small image volume with a relatively thick slice in the z-axis dimension (preselecting) and to then perform high resolution three-dimensional imaging within that sub-volume. In fact, due to the strong built-in gradient, by using suitable x-y gradients, the resulting image would be a small 2-D high resolution image e.g., 2 cm×2 cm×0.1 mm (thickness).

FIGS. 6A–6C depict a simulation of small volume imaging within the outside fringe field of a single small bore magnet. The axial area depicted is 2 centimeters by 2 centimeters (in the x and y dimensions) located at a distance 10 centimeters away from one end of the magnet. Although at this point the static field strength is still about 75% of its maximum, the built-in gradients are extremely strong and on the order of approximately 1,000 gauss per centimeter.

The effect of increasing the strength of the magnetic field gradient is depicted by the progression of simulated images (FIG. 6A, gradient pulses of 10 Gauss per centimeter, FIG. 6B using gradient pulses of 20 Gauss per centimeter and FIG. 6C using gradient pulses of 30 Gauss per centimeter). As expected, relatively small image distortion is seen when the selected image volume is relatively small. This type of selected small volume using a single magnet fringe field should be an important human in-vivo imaging technique and spectroscopic modality.

FIGS. 7–9 depict another embodiment in which the image volume 110 is located between the spaced-apart ends of a pair of magnets 100. Again, similar reference numerals are used to depict similar parts in FIG. 7.

As depicted in FIG. 8, although there is a relatively much more homogenous distribution of static magnetic fields within the image volume 110, there is still a substantial gradient whenever one deviates materially from a position mid-way between the two magnet ends. The gap or separation between the two magnets and the bore sizes are important determinants of the image volume size in which the fields are sufficiently "homogenous" to permit imaging and spectroscopy.

FIGS. 9A, 9B and 9C depict simulated images taken near the center of the gap between the two magnets of FIG. 7 but using several different intensities of pulsed magnetic gradient fields during the imaging procedure. FIG. 9A depicts an image taken with zero off-set and a magnetic gradient pulse strength of 10 gauss per centimeter. FIG. 9B depicts a better image even at 2 centimeters off-set from the center with a considerably stronger gradient pulse of 20 Gauss per centimeter. FIG. 9C is also located at a 2 centimeter off-set but with a somewhat stronger magnetic gradient pulse intensity of 30 Gauss per centimeter. When the gradient polarity is in opposition to the built-in z-axis gradient, the image obtained even at the center (i.e, zero off-set as in FIG. 9A) appears more distorted than images taken at positions slightly off center (e.g., as in FIGS. 9B and 9C). It also appears that less image distortion at the off-set positions occurs when larger intensity magnetic gradient pulses are employed.

RF coil configurations for fringe field MRI are not depicted in the drawings because conventional RF coil arrangement are believed suitable. For example, the usual circular cage type of RF coil (e.g., saddle coils, ring resonators, simple solenoidal coils, etc.) are believed suitable. As is usual, care must be taken to have the RF magnetic field properly oriented with respect to the static magnetic field as in conventional MRI. As examples, the conventional ring resonator may be used for fringe field MRI inside a single magnet bore. For fringe field MRI outside the bore of a single magnet (and for fringe field MRI in the gap between the ends of two magnets), one can utilize simpler solenoidal RF coils. Of course, any form of surface RF coil may also be used for fringe field MRI as in conventional MRI.

Gradient coil design is always an important design consideration for MRI. However, the same basic gradient coil configurations per se are believed to be useful in fringe field MRI for generating relatively uniform, symmetric and sufficiently strong gradient fields. Of course, as previously mentioned, the size of conductors, numbers of turns, etc. may have to be adjusted so as to generate the relatively stronger required magnetic gradient pulses. Similarly, the gradient current drivers will have to be made more robust so as to generate required higher levels of currents. Where asymmetric gradient fields are desired (e.g., for the one magnet embodiments utilizing fringe fields outside the bore) an asymmetric version of otherwise conventional gradient coils can be utilized.

FIG. 10(A) depicts a symmetric gradient coil configuration suitable for use with the FIG. 1 embodiment involving gradient coil configurations substantially identical to conventional MRI systems utilizing horizontal magnet bores. Here, two split Golay coil sets are utilized for x and y gradients (only the x-gradient coil being explicitly depicted so as to reduce drawing clutter). The usual z-axis gradient coils are also depicted in FIG. 10(A).

FIG. 10(B) depicts an asymmetric gradient coil configuration suitable for use with the FIG. 4 single magnet embodiment. Here, an asymmetrical single gradient coil configuration is used for both the x and y gradients while a symmetric z-gradient coil set is utilized with respect to the image volume. In this configuration, asymmetric gradient fields would result (to complement the asymmetric static gradient fields) and thus a suitable adjustment for optimized, linear, symmetrical, composite gradient field formulations is preferred.

FIG. 10(C) depicts a symmetrical gradient coil configuration suitable for use with the FIG. 7 embodiment. Here, the gradient coils (again only the x-gradient coil is explicitly depicted so as to avoid unnecessary drawing clutter with the identical y-axis gradient coil rotated by 90° relative to that of the x-axis gradient coil) require increased intensity gradients so as to partially compensate for inhomogeneities within the image volume located in gap between the ends of the two magnets.

FIG. 11(A) depicts a pulse sequence for localized chunk 3-D imaging utilizing the built-in z gradient for volume selection as well as readout, without additional z directional gradient fringe field imaging. This is a sequence known as a curved chunk 3-D technique. The proposed imaging pulse sequence actively utilizes the built-in gradient field for volume selection without additional z directional gradient. Again, the built-in gradient will be used for the readout gradient. By selecting a limited volume (power volume) and imaging in a localized region, the total measurement time can be reduced considerably. In order to select a sufficiently large volume under a strong built-in gradient, large RF bandwidth is usually required, however.

This problem has been solved in the conventional slice selection techniques (amplitude modulation) by use of a wide bandwidth RF pulse which, in turn, requires larger peak power. For example, to double the bandwidth, four times higher peak power is required. One way to distribute the confined RF signal in time domain is to use a linear sweep FM pulse as shown in FIG. 12.

The FM signal here used is based on a linear frequency sweep which is given by $$f(t) = W_T(t)\exp(i\beta t^2) \qquad \text{[Equation 1]}$$

or $$f(t) = W_T(t)\exp[iw(t)t/2] \qquad \text{[Equation 2]}$$

where $\beta$ is the frequency modulation index which is expressed as $\pi\Delta f/2T$ with frequency sweep range of $\Delta f$ in hertz and sweep time of $2T$ and $w(t) = 2\beta|t|$.

It is further assumed that a window function $W_T(t)$ of width $2T$ is multiplied on the FM signal in Equation 2. Then the Fourier Transform of Equation 2 is given by $$F(\omega) = \sqrt{\pi/2\beta}\ \exp(-i\omega^2/4\beta)[K((2\beta T - \omega)/\sqrt{2\beta\pi}) + K((2\beta T + \omega)/\sqrt{2\beta\pi})] \qquad \text{[Equation 3]}$$

where $K(w)$ represents the Fresnel integral.

The FM modulated RF signal in time domain and its corresponding spectrum are shown in FIGS. 13 and 14 respectively. Since the bandwidth of the FM pulse is given by $4\beta T$, the bandwidth can easily be controlled by either changing sweep rate $\beta$ or window width $2T$ without changing the amplitude or peak power of the pulse.

The known quadratic phase problem when one uses FM RF pulse can be circumvented by the "curved chunk 3-D sequence" as proposed in FIG. 12. Since in this case the phase is relatively constant within a curved "plane", each "plane" can be reconstructed without much loss of phase coherency. In chunk 3-D imaging, these thin 2-D images then can be superposed along the z direction after magnitude reconstruction to form a thicker slice.

A set of simulation images with chunk-3D technique shown in FIG. 12 is given in FIGS. 15A, 15B and 15C. As mentioned before, the built-in gradient is used for slice selection as well as readout gradient. For 4.7 Tesla 40 cm bore magnet, three sagittal images (readout—z direction) are obtained at *offsets* of 20 cm, 25 cm, and 35 cm. Due to the improved linearity of the built-in gradient, images reconstructed at larger *offset* show less image distortion, although the strength of the built-in gradient is proportionally increased. The requirement of wider band RF pulse is alleviated by the introduction of frequency modulated (FM) RF pulse.

In order to demonstrate fringe field imaging, some preliminary experiments have been performed with a 2.0 Tesla whole body NMR imaging system. The built-in gradient in the experimental system turns out to be as high as 10 Gauss/cm at 52 cm away from the center. This distance is usually considered as too far out for conventional imaging.

Using the above-described curved chunk 3-D technique with frequency modulated RF pulses, the first fringe field human image was obtained and is shown in FIG. 16. In this experiment, the width of the FM RF pulse was 5 msec with a frequency sweep of 40 KHz. The image matrix was 64×64, and the scan time was 30 minutes. This shows that fringe field imaging can be performed under extremely inhomogeneous fields or built-in gradients that typically will be part of a fringe field MRI system.

Although only a few exemplary embodiments of this invention have been described in detail, those skilled in the art will appreciate that many variations and modifications may be made in these exemplary embodiments while yet retaining many of the novel features and advantages of this invention. Accordingly, all such variations and modifications are intended to be included within the scope of the appended claims.

What is claimed is:

1. A magnetic resonance imaging method comprising:
    generating a static, non-homogenous, magnetic fringe field having an intensity greater than 2 Tesla with a static magnetic gradient in excess of 2 Gauss/cm along a predetermined z-axis through an MRI image volume; and
    using said static magnetic gradient in conjunction with an NMR RF pulse during an MRI data acquisition pulse sequence to achieve volume-selective NMR nutation of nuclei within said MRI image volume.

2. A magnetic resonance imaging method as in claim 1 wherein said magnetic fringe field is generated by at least one solenoidal electromagnet and said fringe field and image volume are located at a position substantially removed from the central center region of the bore of said solenoidal electromagnet.

3. A magnetic resonance imaging method as in claim 2 wherein said position is within the bore but offset toward an end of the electromagnet.

4. A magnetic resonance imaging method as in claim 2 wherein said position is outside the bore and proximate an end of the electromagnet.

5. A magnetic resonance imaging method as in claim 1 wherein said magnetic fringe field and image volume is located at a position between the spaced-apart ends of a pair of electromagnets.

6. A magnetic resonance imaging method as in claim 1 wherein said fringe field has an intensity greater than 3 Tesla.

7. A magnetic resonance imaging method as in claim 1 wherein said fringe field has a static magnetic gradient in excess of 10 gauss/cm along said z-axis.

8. A magnetic resonance imaging method as in claim 1 wherein single quantum NMR responses are elicited from said image volume for said MRI data acquisition.

9. A magnetic resonance imaging method as in claim 1 wherein said using step utilizes at frequency modulated RF pulses.

10. A magnetic resonance imaging method as in claim 1 wherein said generating step utilizes at least one solenoidal, electromagnet having a bore of less than 60 centimeters in diameter.

11. A magnetic resonance imaging method as in claim 1 wherein said generating step utilizes at least one solenoidal electromagnet having a maximum bore diameter which is less than the minimum dimension of said image volume.

12. A magnetic resonance imaging method as in claim 1 wherein said MRI data acquisition pulse sequence utilizes pulsed magnetic gradient fields which are asymmetric with respect to said image volume.

13. A magnetic resonance imaging method for acquiring MRI image data from an image volume located within a non-homogeneous static magnetic field having a substantial static gradient with respect to a predetermined z-axis, said method comprising the steps of:
    (a) transmitting into said volume at least one RF nutation pulse including a predetermined range of frequencies which, in conjunction with said substantial static gradient, produces volume-selective first NMR nutation of NMR nuclei within a selected sub-volume of said image volume;
    (b) generating at least one phase-encoding magnetic gradient pulse to phase-encode NMR nuclei within said sub-volume with respect to at least one further axis orthogonal to said z-axis;
    (c) transmitting into said volume at least one further RF nutation pulse including a predetermined range of frequencies which, in conjunction with said substantial static gradient, produces volume-selective second NMR nutation of NMR nuclei within said selected sub-volume; and
    (d) thereafter recording NMR RF responses from said sub-volume to provide acquired MRI image data.

14. A magnetic resonance imaging method as in claim 13 wherein during said transmitting steps (a) and (c) there is substantially no magnetic gradient present in said sub-volume except said static magnetic gradients.

15. A magnetic resonance imaging method as in claim 13 wherein, during at least step (b), a magnetic gradient field is utilized which is asymmetrically and non-homogeneously distributed within said image volume.

16. Magnetic resonance imaging apparatus comprising:
    means for generating a static, non-homogenous, magnetic fringe field having an intensity greater than 2 Tesla with a static magnetic gradient in excess of 2 Gauss/cm along a predetermined z-axis through an MRI image volume; and
    means for using said static magnetic gradient in conjunction with an NMR RF pulse during an MRI data acquisition pulse sequence to achieve volume-selective NMR nutation of nuclei within said MRI image volume.

17. Magnetic resonance imaging apparatus as in claim 16 wherein said means for generating includes at least one solenoidal electromagnet and said fringe field and image volume are located at a position substantially removed from the central center region of the bore of said solenoidal electromagnet.

18. Magnetic resonance imaging apparatus as in claim 17 wherein said position is within the bore but offset toward an end of the electromagnet.

19. Magnetic resonance imaging apparatus as in claim 17 wherein said position is outside the bore and proximate an end of the electromagnet.

20. Magnetic resonance imaging apparatus as in claim 16 wherein said magnetic fringe field and image volume is located at a position between the spaced-apart ends of a pair of electromagnets.

21. Magnetic resonance imaging apparatus as in claim 16 wherein said fringe field has an intensity greater than 10 Tesla.

22. Magnetic resonance imaging apparatus as in claim 16 wherein said fringe field has a static magnetic gradient in excess of 10 gauss/cm along said z-axis.

23. Magnetic resonance imaging apparatus as in claim 16 wherein said means for using includes means for eliciting single quantum NMR responses are from said image volume for said MRI data acquisition.

24. Magnetic resonance imaging apparatus as in claim 16 wherein said means for using includes means for generating frequency modulated RF pulses.

25. Magnetic resonance imaging apparatus as in claim 16 wherein said means for generating includes at least one solenoidal, electromagnet having a bore of less than 50 centimeters in diameter.

26. Magnetic resonance imaging apparatus as in claim 16 wherein said means for generating includes at least one solenoidal electromagnet having a maximum bore diameter which is less than the minimum dimension of said image volume.

27. Magnetic resonance imaging apparatus as in claim 16 wherein said means for using includes means for generating pulsed magnetic gradient fields which are asymmetric with respect to said image volume.

28. Magnetic resonance imaging apparatus for acquiring MRI image data from an image volume located within a non-homogeneous static magnetic field having a substantial static gradient with respect to a predetermined z-axis, said apparatus comprising:
(a) means for transmitting into said volume at least one RF nutation pulse including a predetermined range of frequencies which, in conjunction with said substantial static gradient, produces volume-selective first NMR nutation of NMR nuclei within a selected sub-volume of said image volume;
(b) means for generating at least one phase-encoding magnetic gradient pulse to phase-encode NMR nuclei within said sub-volume with respect to at least one further axis orthogonal to said z-axis;
(c) means for transmitting into said volume at least one further RF nutation pulse including a predetermined range of frequencies which, in conjunction with said substantial static gradient, produces volume-selective second NMR nutation of NMR nuclei within said selected sub-volume; and
(d) means for thereafter recording NMR RF responses from said sub-volume to provide acquired MRI image data.

29. Magnetic resonance imaging apparatus as in claim 28 wherein during operation of said means for transmitting there is substantially no magnetic gradient present in said sub-volume except said static magnetic gradients.

30. Magnetic resonance imaging apparatus as in claim 28 further comprising:
means for generating at least one compensating magnetic gradient pulse within said sub-volume with respect to said z-axis at times other than during operation of said means for transmitting to thereby provide some compensation for the inhomogeneity of said static magnetic fields.

31. Magnetic resonance imaging apparatus as in claim 28 further comprising:
means for generating a further phase-encoding magnetic gradient pulse during said recording step to phase-encode nuclei within said sub-volume with respect to a still further axis also orthogonal to said z-axis.

32. Magnetic resonance imaging apparatus as in claim 28 wherein, during operation of at least said means for transmitting (b) means for generating a magnetic gradient field is utilized which gradient field is asymmetrically and non-homogeneously distributed within said image volume.

33. Magnetic resonance imaging apparatus comprising:
a pair of spaced-apart solenoidal electromagnets having an MRI image volume located between their respective bores within a non-homogeneous static magnetic fringe field;
magnetic gradient coils and RF coils disposed about said image volume; and
driving and receiving means connected to said gradient and RF coils for acquiring MRI data from said image volume while utilizing, at least in part, said non-homogeneous static field to effect volume-selective NMR nutations.

34. Magnetic resonance imaging apparatus comprising:
a solenoidal electromagnet producing a non-homogeneous static magnetic fringe field located off-center within its bore proximate one end thereof;
magnetic gradient and RF coils disposed about an MRI image volume disposed within said non-homogenous fringe static magnetic field; and
driving and receiving means connected to said gradient and RF coils for acquiring MRI data from said image volume.

35. Magnetic resonance imaging apparatus as in claim 33 or 34 wherein the bore of each said electromagnet is substantially less than 1 meter in diameter.

36. Magnetic resonance imaging apparatus as in claim 33 or 34 wherein the bore of each said electromagnet is less than 50 centimeters in diameter.

37. Magnetic resonance imaging apparatus as in claim 33 wherein the bore of each said electromagnet is less in maximum diameter than the minimum dimension of said image volume.

38. Magnetic resonance imaging apparatus comprising:
a pair of spaced-apart solenoidal electromagnets having an MRI image volume located between their respective bores within a non-homogeneous static magnetic fringe field;
magnetic gradient coils and RF coils disposed about said image volume; and
driving and receiving means connected to said gradient and RF coils for acquiring MRI data from said image volume while utilizing, at least in part, said non-homogeneous static field to effect volume-selective NMR nutations;
wherein said fringe field is in excess of 4 Tesla.

39. Magnetic resonance imaging apparatus comprising:
a pair of spaced-apart solenoidal electromagnets having an MRI image volume located between their respective bores within a non-homogeneous static magnetic fringe field;
magnetic gradient coils and RF coils disposed about said image volume; and
driving and receiving means connected to said gradient and RF coils for acquiring MRI data from said image volume while utilizing, at least in part, said non-homogeneous static field to effect volume-selective NMR nutations;
wherein said fringe field is in excess of 10 Tesla.

40. Magnetic resonance imaging apparatus comprising:

a pair of spaced-apart solenoidal electromagnets having an MRI image volume located between their respective bores within a non-homogeneous static magnetic fringe field;

magnetic gradient coils and RF coils disposed about said image volume; and driving and receiving means connected to said gradient and RF coils for acquiring MRI data from said image volume while utilizing, at least in part, said non-homogeneous static field to effect volume-selective NMR nutations;

wherein said fringe field has a static gradient in excess of 2 Gauss/cm.

41. Magnetic resonance imaging apparatus comprising:

a pair of spaced-apart solenoidal electromagnets having an MRI image volume located between their respective bores within a non-homogeneous static magnetic fringe field;

magnetic gradient coils and RF coils disposed about said image volume; and driving and receiving means connected to said gradient and RF coils for acquiring MRI data from said image volume while utilizing, at least in part, said non-homogeneous static field to effect volume-selective NMR nutations;

wherein said fringe field has a static gradient in excess of 10 Gauss/cm.

42. Magnetic resonance imaging apparatus comprising:

a pair of spaced-apart solenoidal electromagnets having an MRI image volume located between their respective bores within a non-homogeneous static magnetic fringe field;

magnetic gradient coils and RF coils disposed about said image volume; and driving and receiving means connected to said gradient and RF coils for acquiring MRI data from said image volume while utilizing, at least in part, said non-homogeneous static field to effect volume-selective NMR nutations;

wherein said driving means includes means for generating frequency modulated RF pulses and transmitting them into said image volume to volume-selectively effect NMR nutation of NMR nuclei within a selected sub-volume defined by the range of frequencies included in said RF pulse and a static magnetic field gradient included in said fringe field.

43. Magnetic resonance imaging apparatus comprising:

a pair of spaced-apart solenoidal electromagnets having an MRI image volume located between their respective bores within a non-homogeneous static magnetic fringe field;

magnetic gradient coils and RF coils disposed about said image volume; and driving and receiving means connected to said gradient and RF coils for acquiring MRI data from said image volume while utilizing, at least in part, said non-homogeneous static field to effect volume-selective NMR nutations;

wherein said magnetic gradient coils include magnetic gradient coil means asymmetrically located with respect to said image volume for producing an asymmetric gradient field along a predetermined axis within said image volume during predetermined portions of an MRI data acquisition pulse sequence.

44. Magnetic resonance imaging apparatus comprising:

a solenoidal electromagnet producing a non-homogeneous static magnetic fringe field located off-center within its bore proximate one end thereof;

magnetic gradient and RF coils disposed about an MRi image volume disposed within said non-homogeneous fringe static magnetic field; and driving and receiving means connected to said gradient and RF coils for acquiring MRI data from said image volume wherein said fringe field is in excess of 4 Tesla.

45. Magnetic resonance imaging apparatus comprising:

a solenoidal electromagnet producing a non-homogeneous static magnetic fringe field located off-center within its bore proximate one end thereof;

magnetic gradient and RF coils disposed about an MRi image volume disposed within said non-homogeneous fringe static magnetic field; and driving and receiving means connected to said gradient and RF coils for acquiring MRI data from said image volume wherein said fringe field is in excess of 10 Tesla.

46. Magnetic resonance imaging apparatus comprising:

a solenoidal electromagnet producing a non-homogeneous static magnetic fringe field located off-center within its bore proximate one end thereof;

magnetic gradient and RF coils disposed about an MRi image volume disposed within said non-homogeneous fringe static magnetic field; and driving and receiving means connected to said gradient and RF coils for acquiring MRI data from said image volume wherein said fringe field has a static gradient in excess of 2 Gauss/cm.

47. Magnetic resonance imaging apparatus comprising:

a solenoidal electromagnet producing a non-homogeneous static magnetic fringe field located off-center within its bore proximate one end thereof;

magnetic gradient and RF coils disposed about an MRi image volume disposed within said non-homogeneous fringe static magnetic field; and driving and receiving means connected to said gradient and RF coils for acquiring MRI data from said image volume wherein said fringe field has a static gradient in excess of 10 Gauss/cm.

48. Magnetic resonance imaging apparatus comprising:

a solenoidal electromagnet producing a non-homogeneous static magnetic fringe field located off-center within its bore proximate one end thereof;

magnetic gradient and RF coils disposed about an MRi image volume disposed within said non-homogeneous fringe static magnetic field; and driving and receiving means connected to said gradient and RF coils for acquiring MRI data from said image volume wherein said driving means includes means for generating frequency modulated RF pulses and transmitting them into said image volume to volume-selectively effect NMR nutation of NMR nuclei within a selected sub-volume defined by the range of frequencies included in said RF pulse and a static magnetic field gradient included in said fringe field.

49. Magnetic resonance imaging apparatus comprising:

a solenoidal electromagnet producing a non-homogeneous static magnetic fringe field located off-center within its bore proximate one end thereof;

magnetic gradient and RF coils disposed about an MRI image volume disposed within said non-homogeneous fringe static magnetic field; and driving and receiving means connected to said gradient and RF coils for acquiring MRI data from said image volume wherein said magnetic gradient coils include magnetic gradient coil means asymmetrically located with respect to said image volume for producing an asymmetric gradient field along a predetermined axis within said image volume during predetermined portions of an MRI data acquisition pulse sequence.

* * * * *